(12) United States Patent
Kao et al.

(10) Patent No.: US 11,963,365 B2
(45) Date of Patent: Apr. 16, 2024

(54) BACK-END ACTIVE DEVICE, SEMICONDUCTOR DEVICE AND SEMICONDUCTOR CHIP

(71) Applicant: Taiwan Semiconductor Manufacturing Company, Ltd., Hsinchu (TW)

(72) Inventors: Yun-Feng Kao, New Taipei (TW); Katherine H Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 241 days.

(21) Appl. No.: 17/674,858

(22) Filed: Feb. 18, 2022

(65) Prior Publication Data

US 2023/0269948 A1 Aug. 24, 2023

(51) Int. Cl.
*H10B 51/40* (2023.01)
*G11C 11/22* (2006.01)
(Continued)

(52) U.S. Cl.
CPC ............ *H10B 51/40* (2023.02); *G11C 11/223* (2013.01); *G11C 11/2275* (2013.01);
(Continued)

(58) Field of Classification Search
CPC ......... H01L 29/41775; H01L 29/42356; H01L 29/516; H01L 29/78391; H10B 51/10;
(Continued)

(56) References Cited

U.S. PATENT DOCUMENTS

| 2011/0012104 A1 | 1/2011 | Kang et al. |
| 2021/0083122 A1* | 3/2021 | Naylor ................ H10B 41/27 |

(Continued)

FOREIGN PATENT DOCUMENTS

| CN | 113921599 | 1/2022 |
| CN | 114093927 A * | 2/2022 ......... H01L 29/0684 |

OTHER PUBLICATIONS

"Office Action of Taiwan Counterpart Application", dated Apr. 18, 2023, p. 1-p. 8.

*Primary Examiner* — Matthew E Warren
(74) *Attorney, Agent, or Firm* — JCIPRNET

(57) ABSTRACT

An active device, a semiconductor device and a semiconductor chip are provided. The active device includes: a channel layer; a top source/drain electrode, disposed at a top side of the channel layer; a first bottom source/drain electrode and a second bottom source/drain electrode, disposed at a bottom side of the channel layer; a first gate structure and a second gate structure, located between the top source/drain electrode and the first bottom source/drain electrode, wherein the first gate structure comprises a non-ferroelectric dielectric layer, and the second gate structure comprises a ferroelectric layer; and a third gate structure and a fourth gate structure, located between the top source/drain electrode and the second bottom source/drain electrode, wherein the third gate structure comprises a non-ferroelectric dielectric layer, and the fourth gate structure comprises a ferroelectric layer.

20 Claims, 14 Drawing Sheets

(51) Int. Cl.
  *H01L 29/417*    (2006.01)
  *H01L 29/423*    (2006.01)
  *H01L 29/51*     (2006.01)
  *H01L 29/78*     (2006.01)
  *H03K 19/20*     (2006.01)
  *H10B 51/10*     (2023.01)
  *H10B 51/30*     (2023.01)

(52) U.S. Cl.
  CPC .. *H01L 29/41775* (2013.01); *H01L 29/42356* (2013.01); *H01L 29/516* (2013.01); *H01L 29/78391* (2014.09); *H10B 51/30* (2023.02); *H03K 19/20* (2013.01); *H10B 51/10* (2023.02)

(58) Field of Classification Search
  CPC ........ H10B 51/30; H10B 51/40; H03K 19/20; G11C 11/223; G11C 11/2275
  See application file for complete search history.

(56) References Cited

U.S. PATENT DOCUMENTS

| | | | |
|---|---|---|---|
| 2022/0328501 A1* | 10/2022 | Wu | H01L 29/7869 |
| 2022/0359759 A1* | 11/2022 | Ku | H01L 29/517 |
| 2022/0384656 A1* | 12/2022 | Lee | H01L 21/02565 |
| 2023/0378369 A1* | 11/2023 | Tsai | H01L 29/24 |

\* cited by examiner

BACK-END ACTIVE DEVICE, SEMICONDUCTOR DEVICE AND SEMICONDUCTOR CHIP

BACKGROUND

Along with quick development of electronic devices, computation loads of logic circuits in the electronic devices are increased. The logic circuits include active devices and wirings for interconnecting the active device. The active devices are typically formed on wafer surface, and may dominate a size of wafer surface occupied by the logic circuits. Despite continuously scaling of the active devices, the wafer estate may become even more valuable since more active devices may be required by the logic circuits as a result of the increasing computation loads, and memory circuits including additional active devices for driving memory cells are integrated with the logic circuits in the same semiconductor chip. A solution for releasing the valuable wafer estate is long needed in the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
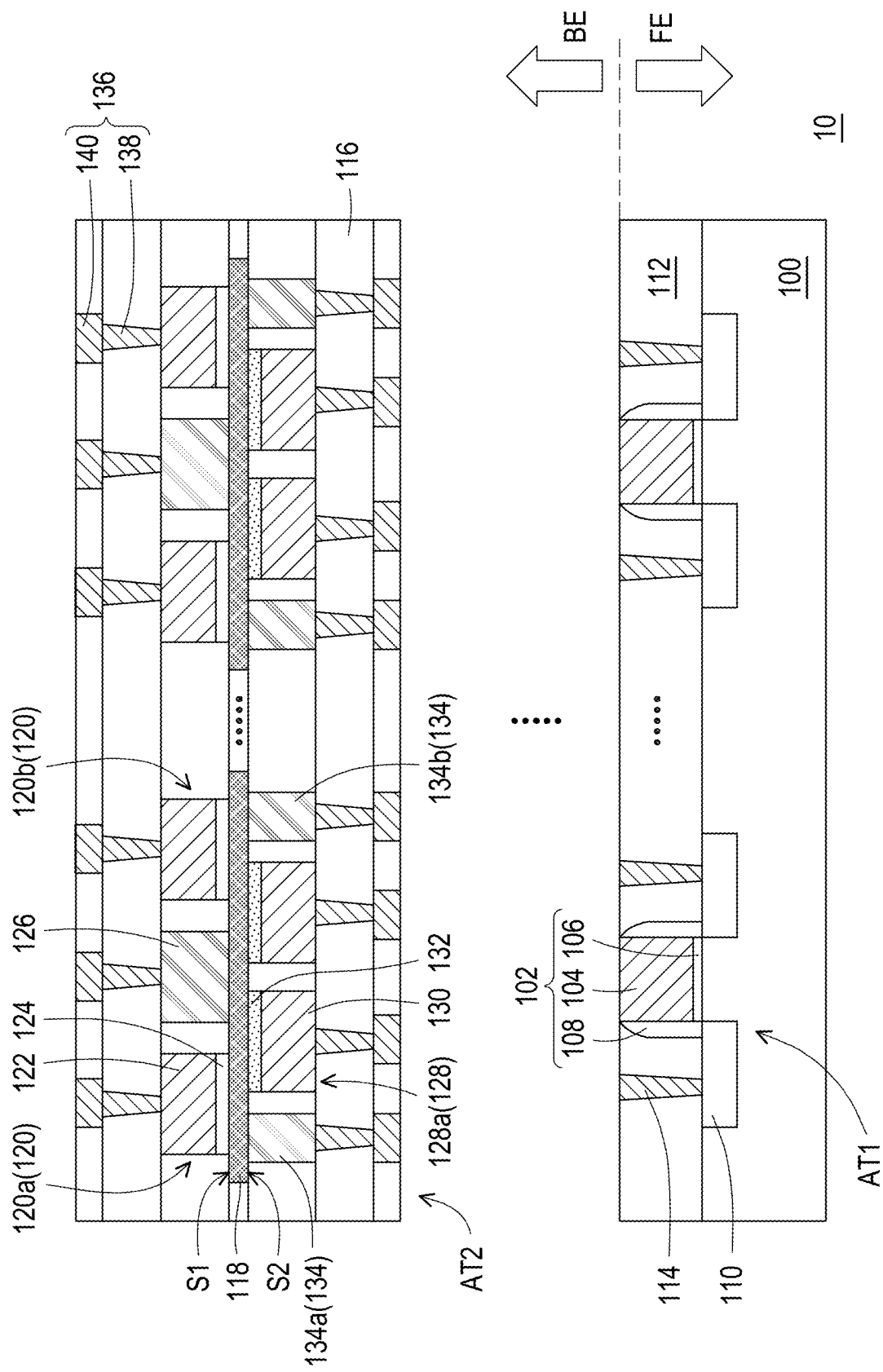
FIG. 1 is a cross-sectional view schematically illustrating a semiconductor chip according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an integrated circuit including at least some of the active devices elevated from a surface of a substrate, for releasing valuable surface area of the substrate.

FIG. 1 is a cross-sectional view schematically illustrating a semiconductor chip 10 according to some embodiments of the present disclosure.

Referring to FIG. 1, the semiconductor chip 10 includes an integrated circuit formed on a substrate 100. The substrate 100 may be a semiconductor substrate or a semiconductor-on-insulator (SOI) substrate. The integrated circuit may include active devices AT1 formed on a surface region of the substrate 100, and includes active devices AT2 elevated from the substrate 100.

The active devices AT1 may respectively include a gate structure 102. The gate structure 102 may include a gate electrode 104 disposed on the substrate 100, and includes a gate dielectric layer 106 separating the gate electrode 104 from the substrate 100 or separating the gate electrode 104 from one or more channel structures formed on the substrate 100. In some embodiments, the gate structure 102 further includes a sidewall spacer 108 covering sidewalls of the gate electrode 104 and the gate dielectric layer 106. In some embodiments where the active devices AT1 are planar-type field effect transistors, the gate structure 102 of each active device AT1 lies on a planar portion of the substrate 100, which may be functioned as a channel region of the active device AT1. In other embodiments where the active devices AT1 are fin-type field effect transistors (finFETs), the gate structure 102 of each active device AT1 may cover and intersect with one or more fin structure(s) on top of the substrate 100 as channel structures of the active device AT1. In yet other embodiments where the active devices AT1 are gate-all-around field effect transistors (GAA FET), the gate structure 102 of each active device AT1 may wrap around each of channel structures stacked on the substrate 100.

Each active device AT1 further includes a pair of source/drain structures 110 at opposite sides of the gate structure 102. In some embodiments, the source/drain structures 110 are doped regions or epitaxial structures formed in a shallow region of the substrate 100. In those embodiments where the active devices AT1 include channel structures formed on the substrate 100, the source/drain structures 110 may be epitaxial structures disposed on the substrate 100 and in lateral contact with the channel structures.

In some embodiments, a dielectric layer 112 may be disposed on the substrate 100. The gate structures 102 of the active devices AT1 may be laterally surrounded by the dielectric layer 112, and the source/drain structures 110 of the active devices AT1 may be covered by the dielectric layer 112. Further, contact plugs 114 may extend through the dielectric layer 112, and establish electrical contact with the source/drain structures 110. A manufacturing process containing formation of the active devices AT1, the dielectric layer 112 and the contact plugs 114 may be referred as a front-end-of-line (FEOL) process, and the substrate 100 as well as the components formed during the FEOL process may be collectively referred as a FEOL structure FE.

A back-end-of-line (BEOL) process may be performed after the FEOL process, and a BEOL structure BE may be formed on the FEOL structure FE. The BEOL structure BE includes dielectric layers 116 stacked on the FEOL structure FE. The active devices AT2 elevated from the substrate 100 are embedded in the stack of dielectric layers 116. As similar to the active devices AT1 in the FEOL structure FE, the active devices AT2 in the BEOL structure BE can also be used to perform logic operations.

The active devices AT2 may each include a channel layer 118. The channel layer 118 of each active device AT2 is laterally surrounded by one of the dielectric layers 116. In addition, the channel layers 118 of laterally adjacent active devices AT2 may be separated from one another, in order to prevent interference between the laterally adjacent active devices AT2. For instance, as shown in FIG. 1, the channel layers 118 of laterally adjacent active devices AT2 may be formed in the same dielectric layer 116, and are laterally spaced apart from each other. The channel layers 118 are formed of a semiconducting material. For instance, material alternatives of the channel layers 118 may include indium zinc oxide (InZnO or IZO), indium tin oxide (ITO), indium oxide (e.g., $In_2O_3$), gallium oxide (e.g., $Ga_2O_3$), indium gallium zinc oxide (InGaZnO or IGZO), zinc oxide (ZnO), aluminum doped zinc oxide (AZO, such as $Al_2O_5Zn_2$), indium tungsten oxide (IWO), titanium oxide, other semiconductor materials comprising group III-V materials, combinations (e.g., alloys or stacked layers) of these materials. Further, in some embodiments, a thickness of each channel layer 118 ranges from about 1 nm to about 30 nm.

Top gate structures 120 are disposed on top sides S1 of the channel layers 118. In some embodiments, each active device AT2 includes a first top gate structure 120a and a second top gate structure 120b laterally separated from each other and configured to control formation of different conduction channels in the underlying channel layer 118. The first top gate structure 120a and the second top gate structure 120b may be laterally surrounded by one of the dielectric layers 116, and respectively include a top gate electrode 122 and a top gate dielectric layer 124 separating the top gate electrode 122 from the underlying channel layer 118. The top gate electrode 122 is functioned as an input terminal of the active device AT2, and is formed of a conductive material. For instance, the conductive material may include TiN, W, TaN, the like or combinations thereof. On the other hand, the top gate dielectric layer 124 is formed of a dielectric material. According to some embodiments, the dielectric material for forming the top gate dielectric layer 124 is non-ferroelectric. As examples, the non-ferroelectric dielectric material may include silicon oxide, hafnium oxide, zirconium oxide, titanium oxide, other high-k dielectric materials or combinations thereof. In some embodiments, a thickness of the top gate electrode 122 ranges from about 20 nm to about 100 nm. Further, in some embodiments, a thickness of the top gate dielectric layer 124 ranges from about 1 nm to about 20 nm.

Further, top source/drain electrodes 126 are also disposed on the top sides S1 of the channel layers 118, and are respectively located between adjacent ones of the top gate structures 120. The top source/drain electrodes 126 may be functioned as output terminals of the active devices AT2. In some embodiments, each active device AT2 includes two of the top gate structures 120 (i.e., a first top gate structure 120a and a second top gate structure 120b) and one of the top source/drain electrodes 126 located between the two top gate structures 120a, 120b. The top source/drain electrode 126 and the top gate structures 120 of each active device AT2 may be laterally surrounded by the same dielectric layer 116, and a thickness of the top source/drain electrode 126 may be substantially equal to a total thickness of the top gate electrode 122 and the top gate dielectric layer 124 in each top gate structure 120. In addition, the top source/drain electrodes 126 may be formed of a conductive material. For instance, the conductive material may include TiN, W, TaN, the like or combinations thereof.

On the other hand, bottom gate structures 128 are disposed at bottom sides S2 of the channel layers 118. As similar to the top gate structures 120 at the top sides S1 of the channel layers 118, the bottom gate structures 128 are respectively configured to control formation of a conduction channel in the overlying channel layer 118. According to some embodiments, each active device AT2 may include two of the bottom gate structures 128, which are referred to as a first bottom gate structure 128a and a second bottom gate structure 128b. The first and second bottom gate structures 128a, 128b are laterally spaced apart from each other. In those embodiments where each active device AT2 includes a first top gate structure 120a, a second top gate structure 120b, a first bottom gate structure 128a and a second bottom gate structure 128b, the first and second bottom gate structures 128a, 128b may be partially overlapped with the first and second top gate structures 120a, 120b. For instance, the first bottom gate structure 128a is partially overlapped with the first top gate structure 120a, and the second bottom gate structure 128b is partially overlapped with the second top gate structure 120b. Further, the first bottom gate structure 128a may be partially overlapped with the top source/drain electrode 126 between the first and second top gate structures 120a, 120b. Similarly, the second bottom gate structure 128b may be partially overlapped with each of the top source/drain electrode 126 and the second top gate structure 120b.

In some embodiments, the bottom gate structure 128a, 128b are laterally surrounded by one of the dielectric layers 116, and respectively include a bottom gate electrode 130 and a ferroelectric layer 132 separating the bottom gate electrode 130 from the overlying channel layer 118. The bottom gate electrode 130 can be capacitively coupled to the overlying channel layer 118 through the ferroelectric layer 132. An electric polarization of the ferroelectric layer 132 can be determined by a programming voltage applied across the ferroelectric layer 132 during a pre-programming operation, and a polarity of a gate capacitor defined between the bottom gate electrode 130 and the overlying channel layer 118 may vary with the electric polarization of the ferroelectric layer 132. In contrast, since the top gate dielectric layer 124 is non-ferroelectric, a polarity and capacitance of a gate capacitor defined between the top gate electrode 122 and the underlying channel layer 118 may be fixed. As similar to the top gate electrode 122, the bottom gate electrode 130 may be functioned as an input terminal of the active device AT2, and may be formed of a conductive material, such as TiN, W, TaN, the like or combinations thereof. The ferroelectric layer 132 may be formed of a ferroelectric material. For instance, the ferroelectric material may include $BaTiO_3$, $PbZrO_3$, $Bi_4Ti_3O_{12}$, $KH_2PO_4$, the like or combinations thereof. In some embodiments, a thickness of the bottom gate electrode 130 ranges from about 20 nm to about 100 nm. Further, in some embodiments, a thickness of the ferroelectric layer 132 ranges from about 3 nm to about 20 nm.

Moreover, bottom source/drain electrodes 134 are also disposed at the bottom sides S2 of the channel layers 118. Each of the bottom gate structures 128 is located between one of the bottom source/drain electrodes 134 and the overlying top source/drain electrode 126, such that a conduction channel between these bottom source/drain electrode 134 and top source/drain electrode 126 can be controlled by the bottom gate structure 128. Similarly, each of the top gate structures 120 is located between one of the bottom source/drain electrodes 134 and the overlying top source/drain electrode 126, and a conduction channel between these bottom source/drain electrode 134 and top source/drain electrode 126 can be controlled by the top gate structure 120.

In those embodiments where each active device AT2 includes two of the top gate structures 120 (i.e., a first top gate structure 120a and a second top gate structure 120b) and two of the bottom gate structures 128 (i.e., a first bottom gate structure 128a and a second bottom gate structure 128b), each active device AT2 may include two of the bottom source/drain electrodes 134, which may be referred to as a first bottom source/drain electrode 134a and a second bottom source/drain electrode 134b. The first and second bottom gate structures 128a, 128b are located between the first and second bottom source/drain electrodes 134a, 134b, such that the first bottom gate structure 128a is located between the first bottom source/drain electrode 134a and the top source/drain electrode 126, and the second bottom gate structure 128b is located between the second bottom source/drain electrode 134b and the top source/drain electrode 126. As a result, formation of a conduction channel between the first bottom source/drain electrode 134a and the top source/drain electrode 126 can be controlled by the first bottom gate structure 128a, and formation of another conduction channel between second bottom source/drain electrode 134b and the top source/drain electrode 126 can be controlled by the second bottom gate structure 128b. Since the first top gate structure 120a is, at least in part, overlapped with the first bottom gate structure 128a, the first top gate structure 120a is located between the first bottom source/drain electrode 134a and the top source/drain electrode 126 as well, and the conduction channel between the first bottom source/drain electrode 134a and the top source/drain electrode 126 can also be controlled by the first top gate structure 120a. Similarly, Since the second top gate structure 120b is, at least in part, overlapped with the second bottom gate structure 128b, the second top gate structure 120b is located between the second bottom source/drain electrode 134b and the top source/drain electrode 126 as well, and the conduction channel between the second bottom source/drain electrode 134b and the top source/drain electrode 126 can also be controlled by the second top gate structure 120b. In other words, the conduction channel at one side of the top source/drain electrode 126 can be controlled by both of the first bottom gate structure 128a and the first top gate structure 120a, and the conduction channel at the other side of the top source/drain electrode 126 can be controlled by both of the second bottom gate structure 128b and the second top gate structure 120b. In some embodiments, the first and second bottom gate structures 128a, 128b as well as the first and second bottom source/drain electrodes 134a, 134b are laterally surrounded by the same dielectric layer 116, and a thickness of the bottom source/drain electrodes 134a, 134b may be substantially equal to a total thickness of the bottom gate electrode 130 and the ferroelectric layer 132 in each of the bottom gate structure 128a, 128b. In addition, the bottom source/drain electrodes 134 may be formed of a conductive material. For instance, the conductive material may include TiN, W, TaN, the like or combinations thereof.

The BEOL structure BE may further include interconnection elements 136 spreading in the stack of dielectric layers 116. The active devices AT1 in the FEOL structure FE and the active devices AT2 in the BEOL structure BE can be routed and interconnected through the interconnection elements 136, and the interconnection elements 136 are electrically connected to gate and source/drain terminals of the active devices AT1, AT2. In some embodiments, the interconnection elements 136 include conductive patterns 138 and conductive vias 140. The conductive patterns 138 extend laterally, and are configured to provide lateral conduction paths. On the other hand, the conductive vias 140 extend vertically, and are configured to provide vertical conduction paths. It should be noted that, although not shown, more dielectric layers 116 and interconnection elements 136 may be formed above the active devices AT2, and between the active devices AT1 and the active devices AT2.

As described above, logic operations can be performed by both of the active devices AT1 in the FEOL structure FE and the active devices AT2 in the BEOL structure BE, rather than limited to the active devices AT1 in the FEOL structure FE. As the logic operations can be partly performed in the BEOL structure BE, valuable estate of the FEOL structure FE can be released, at least in part. Accordingly, more active devices AT1 may be integrated in the FEOL structure FE, or a footprint area of the integrated circuit can be reduced. In addition to releasing valuable estate of the FEOL structure FE, the active devices AT2 are designed to be polymorphic and reconfigurable. As will be further described, a logic function of each active device AT2 may vary with pre-programming scheme, and can be overwritten by another logic function.

Figure 2:
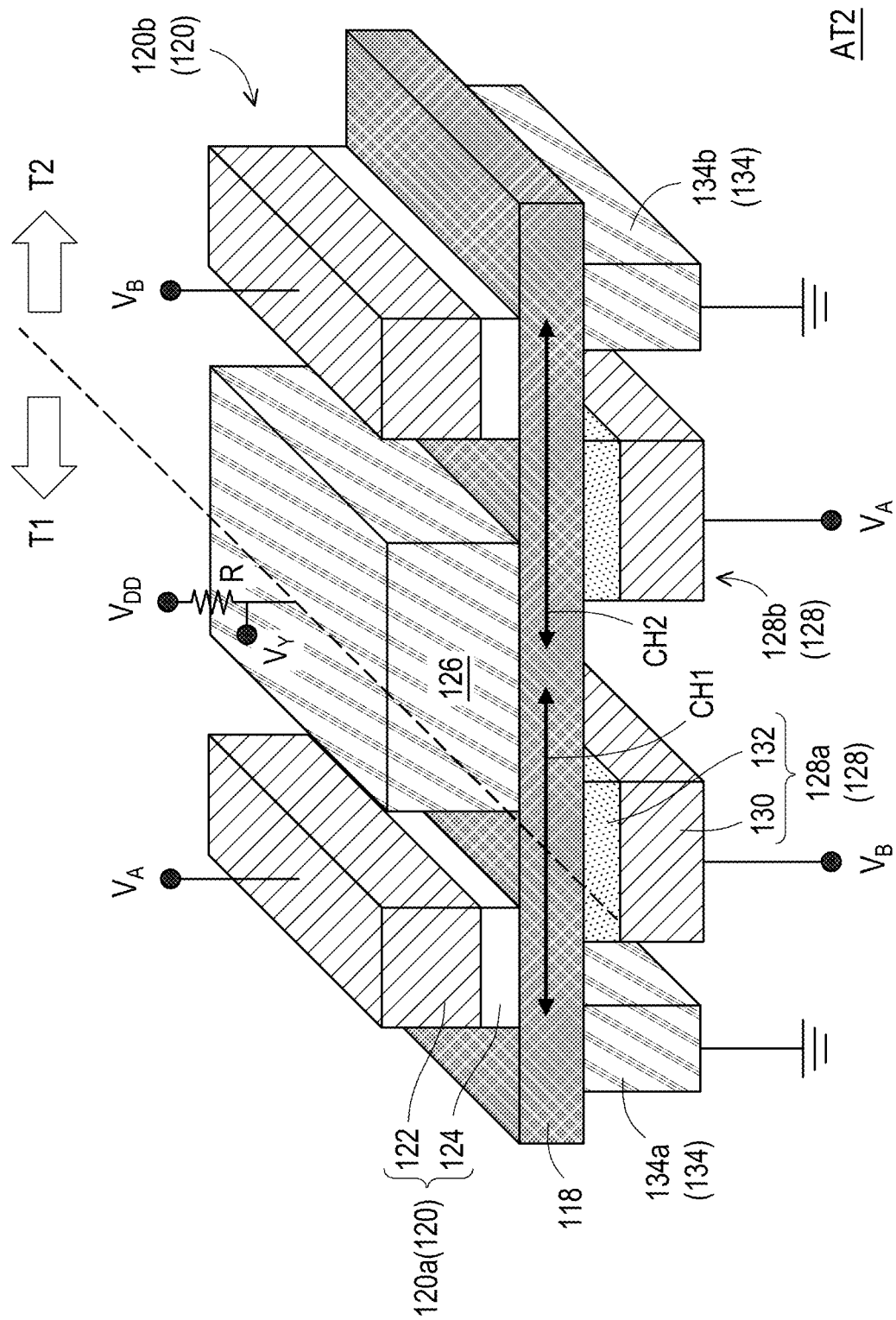
FIG. 2 is a schematic three-dimensional view illustrating one of the back-end active devices shown in FIG. 1, according to some embodiments of the present disclosure.

FIG. 2 is a schematic three-dimensional view illustrating one of the active devices AT2, according to some embodiments of the present disclosure.

Referring to FIG. 2, the active device AT2 may have a first transistor T1 and a second transistor T2 sharing the channel layer 118 and the top source/drain electrode 126. The first transistor T1 may be defined between the top source/drain electrode 126 and the first bottom source/drain electrode 134a. In addition, the first transistor T1 has a first sub-transistor including a gate capacitor defined between the top gate electrode 122 of the first top gate structure 120a and the channel layer 118, and has a second sub-transistor including a gate capacitor defined between the bottom gate electrode 130 of the first bottom gate structure 128a and the channel layer 118. These sub-transistors are serially connected, such that a conduction channel CH1 may be formed between the top source/drain electrode 126 and the first bottom source/drain electrode 134a in the channel layer 118 when both sub-transistors are turned on. The sub-transistor including the gate capacitor defined between the top gate electrode 122 of the first top gate structure 120a and the channel layer 118 has a threshold voltage, and can be turned on only when a gate voltage applied to the top gate electrode 122 of the first top gate structure 120a exceeds the threshold voltage. Similarly, the sub-transistor including the gate capacitor defined between the bottom gate electrode 130 of the first bottom gate structure 128a and the channel layer 118 has its own threshold voltage, and can be turned on only when a gate voltage applied across the bottom gate electrode 130 of the first bottom gate structure 128a exceeds the threshold voltage. In other words, formation of the conduction channel CH1 requires the gate voltages to be greater than the threshold voltages of these sub-transistors, respectively. If the gate voltage applied to one of the first top gate structure 120a and the first bottom gate structure 128a does not reach the corresponding threshold voltage, the conduction channel CH1 may not be established, and the first transistor T1 would be in an off state.

On the other hand, the second transistor T2 may be defined between the top source/drain electrode 126 and the second bottom source/drain electrode 134b. In addition, the second transistor T2 has a first sub-transistor including a gate capacitor defined between the top gate electrode 122 of the second top gate structure 120b and the channel layer 118, and has a second sub-transistor including a gate capacitor defined between the bottom gate electrode 130 of the second bottom gate structure 128b and the channel layer 118. These sub-transistors are serially connected, such that a conduction channel CH2 may be formed between the top source/drain electrode 126 and the second bottom source/drain electrode 134b in the channel layer 118 when both sub-transistors are turned on. The sub-transistor including the gate capacitor defined between the top gate electrode 122 of the second top gate structure 120b and the channel layer 118 has a threshold voltage, and can be turned on only when a gate voltage applied to the top gate electrode 122 of the second top gate structure 120b exceeds the threshold voltage. Similarly, the sub-transistor including the gate capacitor defined between the bottom gate electrode 130 of the second bottom gate structure 128b and the channel layer 118 has its own threshold voltage, and can be turned on only when a gate voltage applied across the bottom gate electrode 130 of the second bottom gate structure 128b exceeds the threshold voltage. In other words, formation of the conduction channel CH2 requires the gate voltages to be greater than the threshold voltages of these sub-transistors, respectively. If the gate voltage applied to one of the second top gate structure 120b and the second bottom gate structure 128b does not reach the corresponding threshold voltage, the conduction channel CH2 may not be established, and the second transistor T2 would be in an off state.

In some embodiments, a gate voltage $V_A$ is applied to the top gate electrode 122 of the first top gate structure 120a and the bottom gate electrode 130 of the second bottom gate structure 128b, and a gate voltage $V_B$ is applied to the bottom gate electrode 130 of the first bottom gate structure 128a and the top gate electrode 122 of the second top gate structure 120b. In these embodiments, the gate voltages $V_A$, $V_B$ are functioned as input signals provided to the active device AT2 during a logic operation.

According to some embodiments, the bottom source/drain electrodes 134a, 134b are coupled to a reference voltage (e.g., a ground voltage). In addition, the top source/drain electrode 126 may be coupled to a power supply voltage $V_{DD}$ through a load resistor R. A terminal of the load resistor R is coupled to the power supply voltage $V_{DD}$, while the other terminal of the load resistor R is functioned as an output terminal of the active device AT2. When at least one of the transistors T1, T2 is turned on, the conduction channel CH1 and/or the conduction channel CH2 can be formed, and a voltage $V_Y$ at the output terminal of the active device AT2 is pulled down to a logic low voltage by the reference voltage. On the other hand, when both of the transistors T1, T2 are in an off state, neither the conduction channel CH1 nor the conduction channel CH2 could be formed, and the voltage $V_Y$ at the output terminal may remain at a logic high voltage.

As described above, the polarity of the gate capacitor defined between the bottom gate electrode 130 of each bottom gate structure 128 and the channel layer 118 can be altered by changing the electric polarization of the ferroelectric layer 132 in each bottom gate structure 128, thus the threshold voltages of the sub-transistors including the gate capacitors can be adjusted. Accordingly, formation of the conduction channels CH1, CH2 and therefore the voltage $V_Y$ at the output terminal can be affected by the electric polarizations of the ferroelectric layers 132 in the bottom gate structures 128. As a result, a logic function of the active device AT2 can be varied by changing electric polarization states of the ferroelectric layers 132 in the bottom gate structures 128.

Figure 3A:
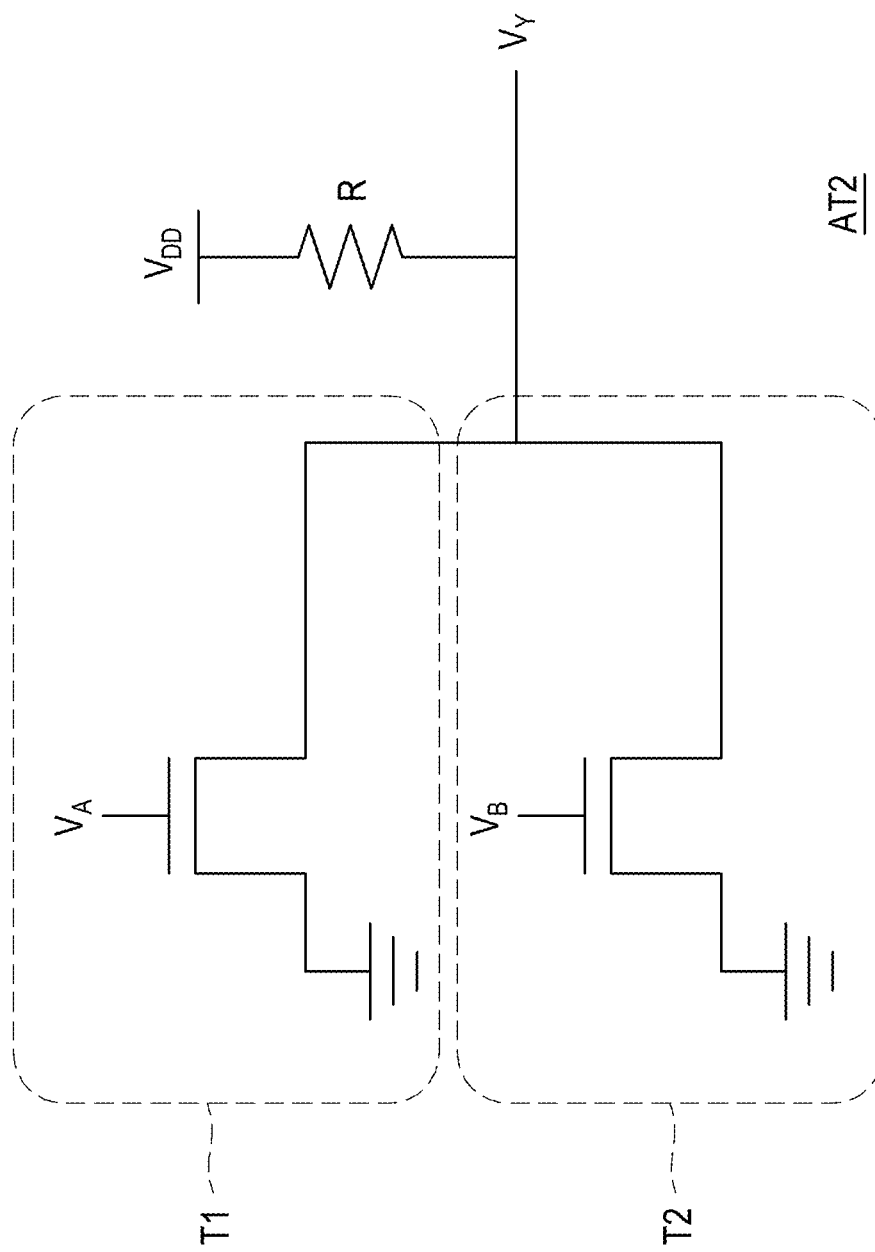
FIG. 3A is a circuit diagram illustrating an equivalent circuit of the back-end active device having ferroelectric layers programmed with a first electric polarization state.

FIG. 3A is a circuit diagram illustrating an equivalent circuit of the active device AT2 having the ferroelectric layers 132 programmed with a first electric polarization state.

Referring to FIG. 2 and FIG. 3A, when the ferroelectric layers 132 are pre-programmed with a first electric polarization state having a polarization direction pointed toward the channel layer 118, electrons may be induced in the channel layer 118 even when the bottom gate electrodes 130 are not provided with positive gate voltages. In embodiments where the channel layer 118 is N-type, the sub-transistors including the gate capacitors defined between the bottom gate electrodes 130 of the bottom gate structures 128a, 128b and the channel layer 118 may respectively have a negative threshold voltage. In these embodiments, these sub-transistors including the gate capacitors defined between the bottom gate electrodes 130 of the bottom gate structures 128a, 128b and the channel layer 118 are normally-on, and can be illustrated as conduction paths. Accordingly, the transistor T1 is formed by a single transistor with a gate terminal provided by the top gate electrode 122 of the first top gate structure 120a, and source and drain terminals provided by the top source/drain electrode 126 and the first bottom source/drain electrode 134a. Similarly, the transistor T2 is formed by a single transistor with a gate terminal provided by the top gate electrode 122 of the second top gate structure 120b, and source and drain terminals provided by the top source/drain electrode 126 and the second bottom source/drain electrode 134b. The top source/drain electrode 126 can be a common source/drain terminal shared by the transistors T1, T2, and is coupled to the output terminal of the active device AT2. The voltage $V_Y$ at the output terminal may indicate an outcome of a logic operation performed by the active device AT2. In some embodiments, the gate voltage $V_A$ provided to the top gate electrode 122 of the first top gate structure 120a is an input for the logic operation performed by the active device AT2, and the gate voltage $V_B$ provided to the top gate electrode 122 of the second top gate structure 120b is another input for the logic operation.

TABLE 1

| $V_A$ | $V_B$ | $V_Y$ |
|---|---|---|
| 0 | 0 | 1 |
| 1 | 0 | 0 |
| 0 | 1 | 0 |
| 1 | 1 | 0 |

Table 1 shows outcomes (i.e., the voltage $V_Y$) of the logic operation performed by the active device AT2 having the ferroelectric layers 132 pre-programmed with the first electric polarization state (as described with reference to FIG. 2 and FIG. 3A), in corresponding to various combinations of inputs (i.e., the gate voltages $V_A$, $V_B$). "1" indicates a logic high voltage, while "0" indicates a logic low voltage. In those embodiments where the channel layer 118 is N-type, each of the transistors T1, T2, which can be regarded as being formed by a single N-type transistor, can be turned on while receiving an input of the logic high voltage, and may be kept in an off state while receiving an input of the logic low voltage. When one or both of the transistors T1, T2 is/are turned on by receiving the logic high voltage, the voltage $V_Y$ at the output terminal would be pulled down to the logic low voltage. On the other hand, when both of the transistors T1, T2 are in an off state, the voltage $V_Y$ may remain at the logic high voltage. As indicated by table 1, the active device AT2 having the ferroelectric layers 132 pre-programmed with the first electric polarization state is functioned as a NOR gate.

Figure 3B:
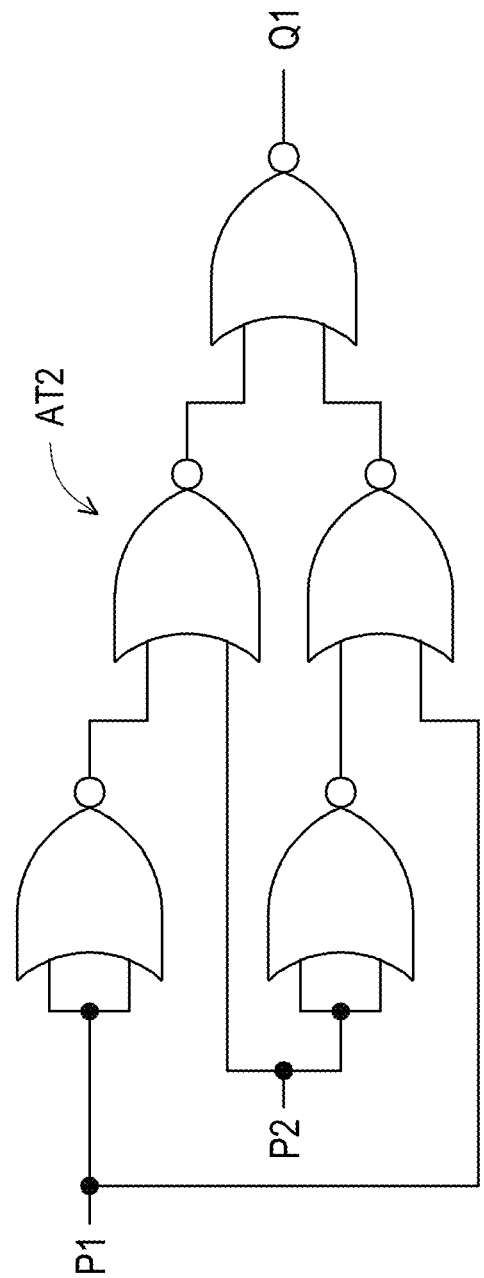
FIG. 3B is a circuit diagram illustrating a XNOR gate including a plurality of the NOR gates each formed by one of the back-end active devices.

FIG. 3B is a circuit diagram illustrating a XNOR gate including a plurality of the NOR gates each formed by one of the active device AT2 as described with reference to FIG. 2 and FIG. 3A.

Referring to FIG. 3B, a plurality of the active device AT2 each having the ferroelectric layers 132 pre-programmed with the first electric polarization state (as described with reference to FIG. 2 and FIG. 3A) are functioned as NOR gates, and can be interconnected to form another logic gate. For instance, as shown in FIG. 3B, 5 of the active devices AT2 functioned as NOR gates can be interconnected to form a XNOR gate with inputs P1, P2 and an output Q1. However, the active devices AT2 as NOR gates can be interconnected to various logic gates, rather than being limited to the XNOR gate as shown in FIG. 3B.

Figure 4A:
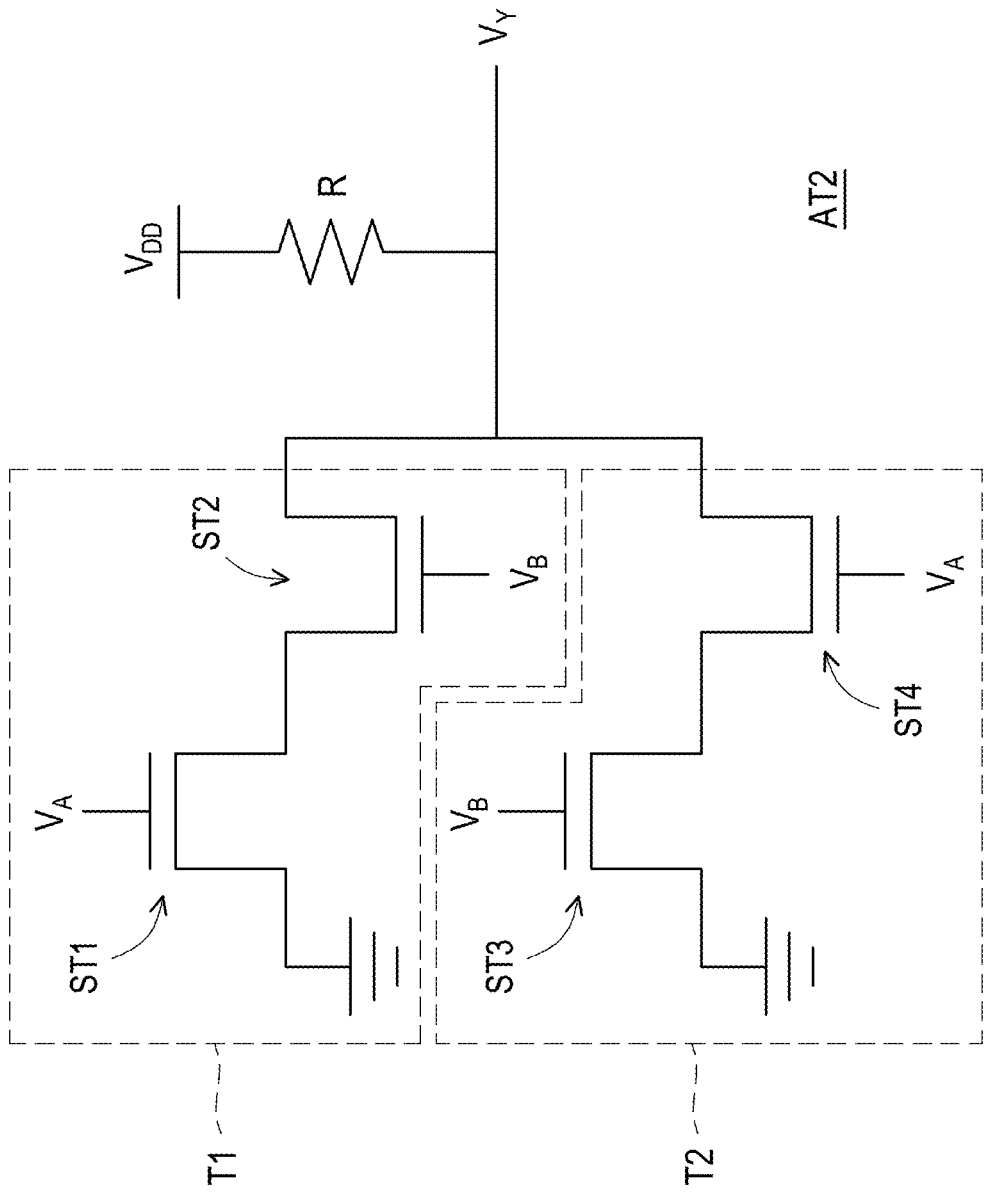
FIG. 4A is a circuit diagram illustrating an equivalent circuit of the back-end active device having the ferroelectric layers programmed with a second electric polarization state.

FIG. 4A is a circuit diagram illustrating an equivalent circuit of the active device AT2 having the ferroelectric layers 132 programmed with a second electric polarization state.

Referring to FIG. 2 and FIG. 4A, when the ferroelectric layers 132 are pre-programmed with a second electric polarization state having a polarization direction pointed away from the channel layer 118, electrons in regions of the channel layer 118 close to the ferroelectric layers 132 may be at least partly depleted even when the bottom gate electrodes 130 are unbiased. In embodiments where the channel layer 118 is N-type, the sub-transistors including the gate capacitors defined between the bottom gate electrodes 130 of the bottom gate structures 128a, 128b and the channel layer 118 may respectively have a positive threshold voltage. In these embodiments, these sub-transistors are normally-off and act as switches, as similar to the sub-transistors including the gate capacitors defined between the top electrodes 122 of the top gate structures 120a, 120b and the channel layer 118.

Accordingly, the transistor T1 includes a first sub-transistor ST1 and a second sub-transistor ST2. The first sub-transistor ST1 includes the gate capacitor defined between the top gate electrode 122 of the first top gate structure 120a and the channel layer 118, and the second sub-transistor ST2 includes the gate capacitor defined between the bottom gate electrode 130 of the first bottom gate structure 128a and the channel layer 118. Similarly, the transistor T2 includes a first sub-transistor ST3 and a second sub-transistor ST4. The first sub-transistor ST3 includes the gate capacitor defined between the top gate electrode 122 of the second top gate structure 120b and the channel layer 118, and the second sub-transistor ST4 includes the gate capacitor defined between the bottom gate electrode 130 of the second bottom gate structure 128b and the channel layer 118.

The sub-transistor ST1 is serially connected with the second sub-transistor ST2, and the sub-transistor ST3 is in serial connection with the sub-transistor ST4. Further, the top source/drain electrode 126 can be a common source/drain terminal shared by the sub-transistors ST2, ST4, and is coupled to the output terminal of the active device AT2. The voltage $V_Y$ at the output terminal may indicate an outcome of a logic operation performed by the active device AT2. In some embodiments, the gate voltage $V_A$ provided to the first top gate structure 120a of the sub-transistor ST1 and the second bottom gate structure 128b of the sub-transistor ST4 is an input for the logic operation performed by the active device AT2, and the gate voltage $V_B$ provided to the first bottom gate structure 128a of the sub-transistor ST2 and the second top gate structure 120b of the sub-transistor ST3 is another input for the logic operation.

The transistor ST1 can be turned on only when both of the first and second sub-transistors ST1, ST2 are turned on. Similarly, the transistor ST2 can be turned on only when both of the first and second sub-transistors ST3, ST4 are turned on. In those embodiments where the gate voltage $V_A$ is provided to the gate terminals of the sub-transistors ST1, ST4 and the gate voltage $V_B$ is provided to the gate terminals of the sub-transistors ST2, ST3, the transistor T1 can be turned on if the gate voltage $V_A$ is greater than a threshold voltage of the sub-transistor ST1, and the gate voltage $V_B$ is greater than a threshold voltage of the sub-transistor ST2. When setting the gate voltages $V_A$, $V_B$ greater than the threshold voltages of the sub-transistors ST1, ST2, the sub-transistors ST3, ST4 may also be turned on if the gate voltages $V_A$, $V_B$ are also greater than threshold voltages of the sub-transistors ST4, ST3, respectively. In other words, the transistors T1, T2 may be turned on at the same time. On the other hand, when the gate voltage $V_A$ is less than the threshold voltage of the sub-transistor ST1 or the gate voltage $V_B$ is less than the threshold voltage of the sub-transistor ST2, the transistor T1 may be kept in an off state. Meanwhile, the gate voltage $V_A$ may not exceed the threshold voltage of the sub-transistor ST4 or the gate voltage $V_B$ may not exceed the threshold voltage of the sub-transistor ST3, thus the transistor T2 may be kept in an off state as well. In other words, switching of the transistors T1, T2 may be interlocked.

TABLE 2

| $V_A$ | $V_B$ | $V_Y$ |
|---|---|---|
| 0 | 0 | 1 |
| 1 | 0 | 1 |
| 0 | 1 | 1 |
| 1 | 1 | 0 |

Table 2 shows outcomes (i.e., the voltage $V_Y$) of the logic operation performed by the active device AT2 having the ferroelectric layers 132 pre-programmed with the second electric polarization state (as described with reference to FIG. 2 and FIG. 4A), in corresponding to various combinations of inputs (i.e., the gate voltages $V_A$, $V_B$). "1" indicates a logic high voltage, while "0" indicates a logic low voltage. In those embodiments where the channel layer 118 is N-type, each of the transistors T1, T2 includes two serially connected N-type sub-transistors, and can be turned on only when both of the N-type sub-transistors receive the logic high voltage as gate voltages. As described above, according to some embodiments, the gate voltage $V_A$ is provided to the sub-transistor ST1 of the transistor T1 and the sub-transistor ST4 of the transistor T2, and the gate voltage $V_B$ is provided to the sub-transistor ST2 of the transistor T1 and the sub-transistor ST3 of the transistor T2. In these embodiments, switching of the transistors T1, T2 can be interlocked. In this way, the voltage $V_Y$ at the output terminal is pulled down to the logic low voltage when both of the gate voltages $V_A$, $V_B$ are provided as the logic high voltage. On the other hand, the voltage $V_Y$ remains at the logic high voltage when at least one of the gate voltages $V_A$, $V_B$ is/are provided as the logic low voltage. As summarized in table 2, the active device AT2 having the ferroelectric layers 132 pre-programmed with the second electric polarization state is functioned as a NAND gate.

Figure 4B:
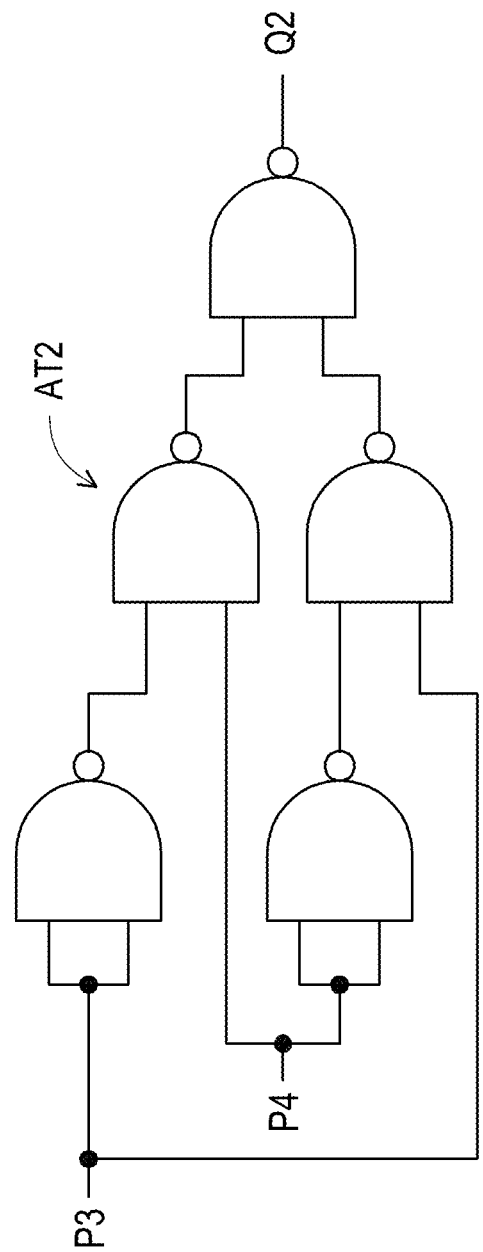
FIG. 4B is a circuit diagram illustrating a XOR gate including a plurality of the NAND gates each formed by one of the back-end active device.

FIG. 4B is a circuit diagram illustrating a XOR gate including a plurality of the NAND gates each formed by one of the active device AT2 as described with reference to FIG. 2 and FIG. 4A.

Referring to FIG. 4B, a plurality of the active device AT2 each having the ferroelectric layers 132 pre-programmed with the second electric polarization state (as described with reference to FIG. 2 and FIG. 4A) are functioned as NAND gates, and can be interconnected to form another logic gate. For instance, as shown in FIG. 4B, 5 of the active devices AT2 functioned as NAND gates can be interconnected to form a XOR gate with inputs P3, P4 and an output Q2. However, the active devices AT2 as NAND gates can be interconnected to various logic gates, rather than being limited to the XOR gate as shown in FIG. 4B.

Figure 5A:
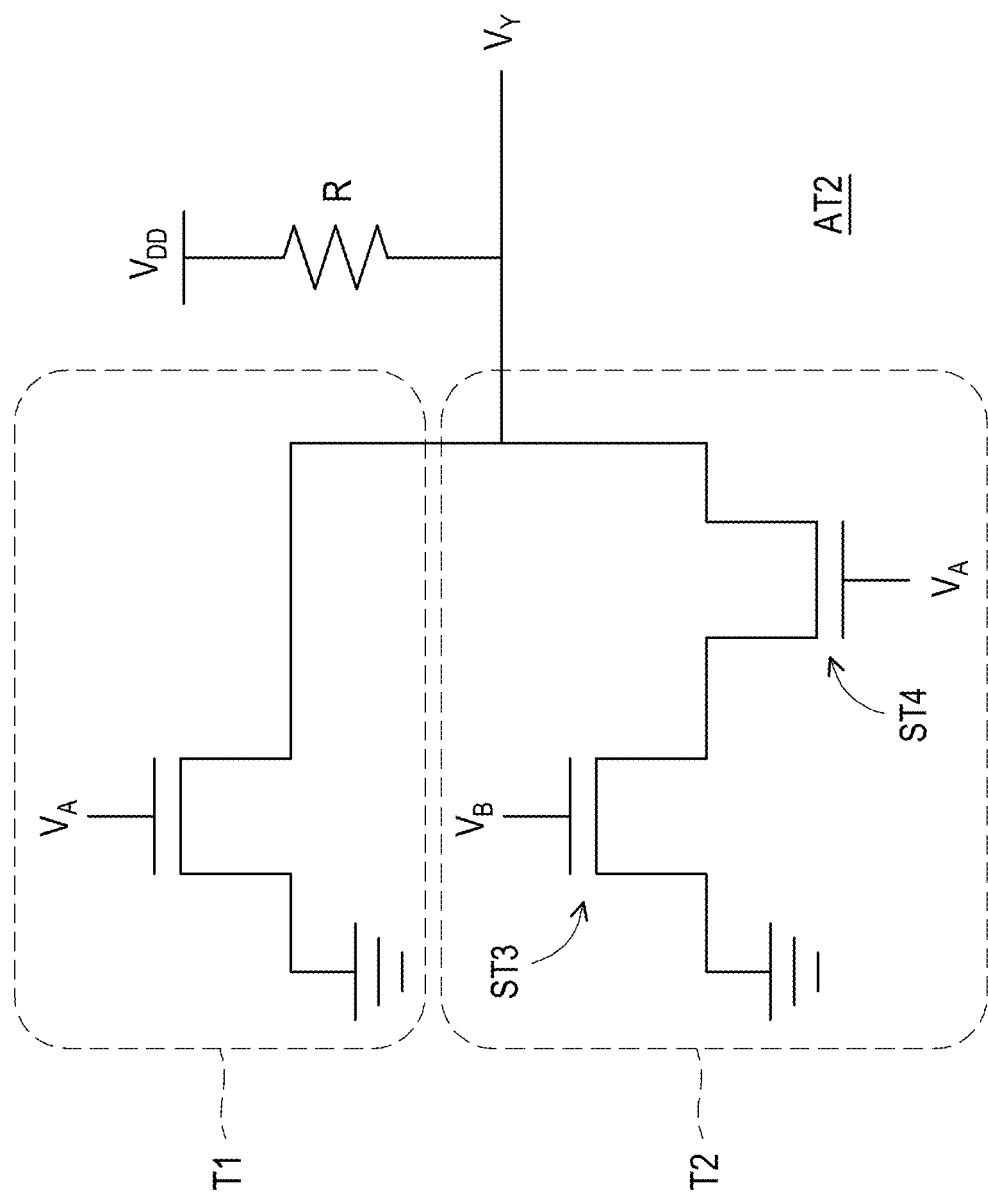
FIG. 5A and FIG. 5B are circuit diagrams respectively illustrating an equivalent circuit of the back-end active device having one of the ferroelectric layers programmed with a first electric polarization state and the other ferroelectric layer programmed with a second electric polarization state.
Figure 5B:
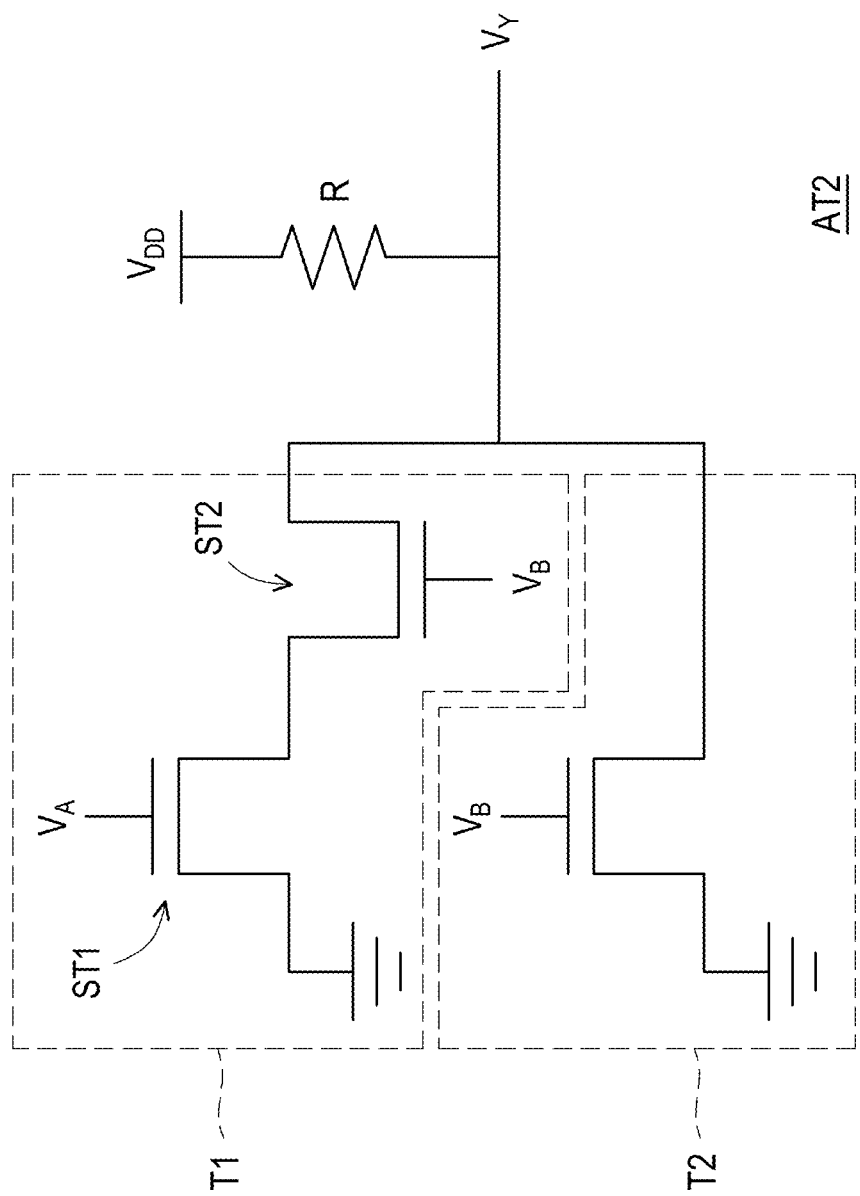

FIG. 5A and FIG. 5B are circuit diagrams respectively illustrating an equivalent circuit of the active device AT2 having one of the ferroelectric layers 132 programmed with a first electric polarization state and the other ferroelectric layer 132 programmed with a second electric polarization state.

Referring to FIG. 2 and FIG. 5A, according to some embodiments, the ferroelectric layer 132 in the bottom gate structure 128a is pre-programmed with the first electric polarization state, while the ferroelectric layer 132 in the bottom gate structure 128b is pre-programmed with the second electric polarization state. As described with reference to FIG. 2 and FIG. 3A, the first electric polarization state has a polarization direction pointed toward the channel layer 118. In embodiments where the channel layer 118 is N-type, the sub-transistor including the gate capacitor defined across the ferroelectric layer 132 with the first electric polarization state may have a negative threshold voltage, and is normally-on. In this way, the transistor T1 is formed by a single transistor with a gate terminal provided by the top gate electrode 122 of the first top gate structure 120a, and source and drain terminals provided by the top source/drain electrode 126 and the first bottom source/drain electrode 134a. On the other hand, as described with reference to FIG. 2 and FIG. 4A, the second polarization state has a polarization direction pointed away from the channel layer 118. Accordingly, the sub-transistor including the gate capacitor defined across the ferroelectric layer 132 with the second electric polarization state is normally-off and acts as a switch (indicated by the sub-transistor ST4 in FIG. 5A), as similar to the sub-transistor ST3 including the gate capacitor defined between the top electrodes 122 of the top gate structure 120b and the channel layer 118. In this way, the transistor T2 may be formed by two serially connected sub-transistors (i.e., the sub-transistors ST3, ST4).

Further, the top source/drain electrode 126 can be a common source/drain terminal shared by the transistor T1 and the sub-transistor ST4 of the transistor T2, and is coupled to the output terminal of the active device AT2. The voltage $V_Y$ at the output terminal may indicate an outcome of a logic operation performed by the active device AT2. In some embodiments, the gate voltage $V_A$ provided to the top gate structure 120a of the transistor T1 and the bottom gate structure 128b of the sub-transistor ST4 is an input for the logic operation performed by the active device AT2, and the gate voltage $V_B$ provided to the second top gate structure 120b of the sub-transistor ST3 is another input for the logic operation. In these embodiments, switching of the transistor T1 is controlled by the gate voltage $V_A$, while switching of the transistor T2 is controlled by both of the gate voltages $V_A$, $V_B$.

TABLE 3

| $V_A$ | $V_B$ | $V_Y$ |
|---|---|---|
| 0 | 0 | 1 |
| 1 | 0 | 0 |
| 0 | 1 | 1 |
| 1 | 1 | 0 |

Table 3 shows outcomes (i.e., the voltage $V_Y$) of the logic operation performed by the active device AT2 having one of the ferroelectric layers 132 pre-programmed with the first electric polarization state and the other ferroelectric layer 132 pre-programmed with the second electric polarization state (as described with reference to FIG. 2 and FIG. 5A), in corresponding to various combinations of inputs (i.e., the gate voltages $V_A$, $V_B$). "1" indicates a logic high voltage, while "0" indicates a logic low voltage. In embodiments where the channel layer 118 is N-type, the transistor T1 can be regarded as being formed by a single transistor, and the transistor T2 is formed by two serially connected N-type sub-transistors. In these embodiments, the transistor T1 can be turned on only when the gate voltage $V_A$ provided thereto is the logic high voltage, and the transistor T2 can be turned on only when the gate voltages $V_A$, $V_B$ provided thereto are both the logic high voltage. When at least one of the transistors T1, T2 is/are turned on, the voltage $V_Y$ at the output terminal is pulled down to the logic low voltage. On the other hand, when both of the transistors T1, T2 are in an off state, the voltage $V_Y$ may remain at the logic high voltage.

Referring to FIG. 2 and FIG. 5B, according to some embodiments, the ferroelectric layer 132 in the bottom gate structure 128b is pre-programmed with the first electric polarization state, while the ferroelectric layer 132 in the bottom gate structure 128a is pre-programmed with the second electric polarization state. As described with reference to FIG. 2 and FIG. 3A, the first electric polarization state has a polarization direction pointed toward the channel layer 118. In embodiments where the channel layer 118 is N-type, the sub-transistor including the gate capacitor defined across the ferroelectric layer 132 with the first electric polarization state may have a negative threshold voltage, and is normally-on. In this way, the transistor T2 is formed by a single transistor with a gate terminal provided by the top gate electrode 122 of the first top gate structure 120b, and source and drain terminals provided by the top source/drain electrode 126 and the second bottom source/drain electrode 134b. On the other hand, as described with reference to FIG. 2 and FIG. 4A, the second polarization state has a polarization direction pointed away from the channel layer 118. Accordingly, the sub-transistor including the gate capacitor defined across the ferroelectric layer 132 with the second electric polarization state is normally-off and acts as a switch (indicated by the sub-transistor ST2 in FIG. 5B), as similar to the sub-transistor ST1 including the gate capacitor defined between the top electrodes 122 of the top gate structure 120a and the channel layer 118. In this way, the transistor T1 may be formed by two serially connected sub-transistors (i.e., the sub-transistors ST1, ST2).

Further, the top source/drain electrode 126 can be a common source/drain terminal shared by the transistor T2 and the sub-transistor ST2 of the transistor T1, and is coupled to the output terminal of the active device AT2. The voltage $V_Y$ at the output terminal may indicate an outcome of a logic operation performed by the active device AT2. In some embodiments, the gate voltage $V_A$ provided to the sub-transistor ST1 of the transistor T1 is an input for the logic operation performed by the active device AT2, and the gate voltage $V_B$ provided to the transistor T2 and the sub-transistor ST2 of the transistor T1 is another input for the logic operation. In these embodiments, switching of the transistor T2 is controlled by the gate voltage $V_B$, while switching of the transistor T1 is controlled by both of the gate voltages $V_A$, $V_B$.

TABLE 4

| $V_A$ | $V_B$ | $V_Y$ |
|---|---|---|
| 0 | 0 | 1 |
| 1 | 0 | 1 |
| 0 | 1 | 0 |
| 1 | 1 | 0 |

Table 4 shows outcomes (i.e., the voltage $V_Y$) of the logic operation performed by the active device AT2 having one of the ferroelectric layers 132 pre-programmed with the first electric polarization state and the other ferroelectric layer 132 pre-programmed with the second electric polarization state (as described with reference to FIG. 2 and FIG. 5B), in corresponding to various combinations of inputs (i.e., the gate voltages $V_A$, $V_B$). "1" indicates a logic high voltage, while "0" indicates a logic low voltage. In embodiments where the channel layer 118 is N-type, the transistor T2 can be regarded as being formed by a single transistor, and the transistor T1 is formed by two serially connected N-type sub-transistors. In these embodiments, the transistor T2 can be turned on only when the gate voltage $V_B$ provided thereto is the logic high voltage, and the transistor T1 can be turned on only when the gate voltages $V_A$, $V_B$ provided thereto are both the logic high voltage. When at least one of the transistors T1, T2 is/are turned on, the voltage $V_Y$ at the output terminal is pulled down to the logic low voltage. On the other hand, when both of the transistors T1, T2 are in an off state, the voltage $V_Y$ may remain at the logic high voltage.

Figure 6A:
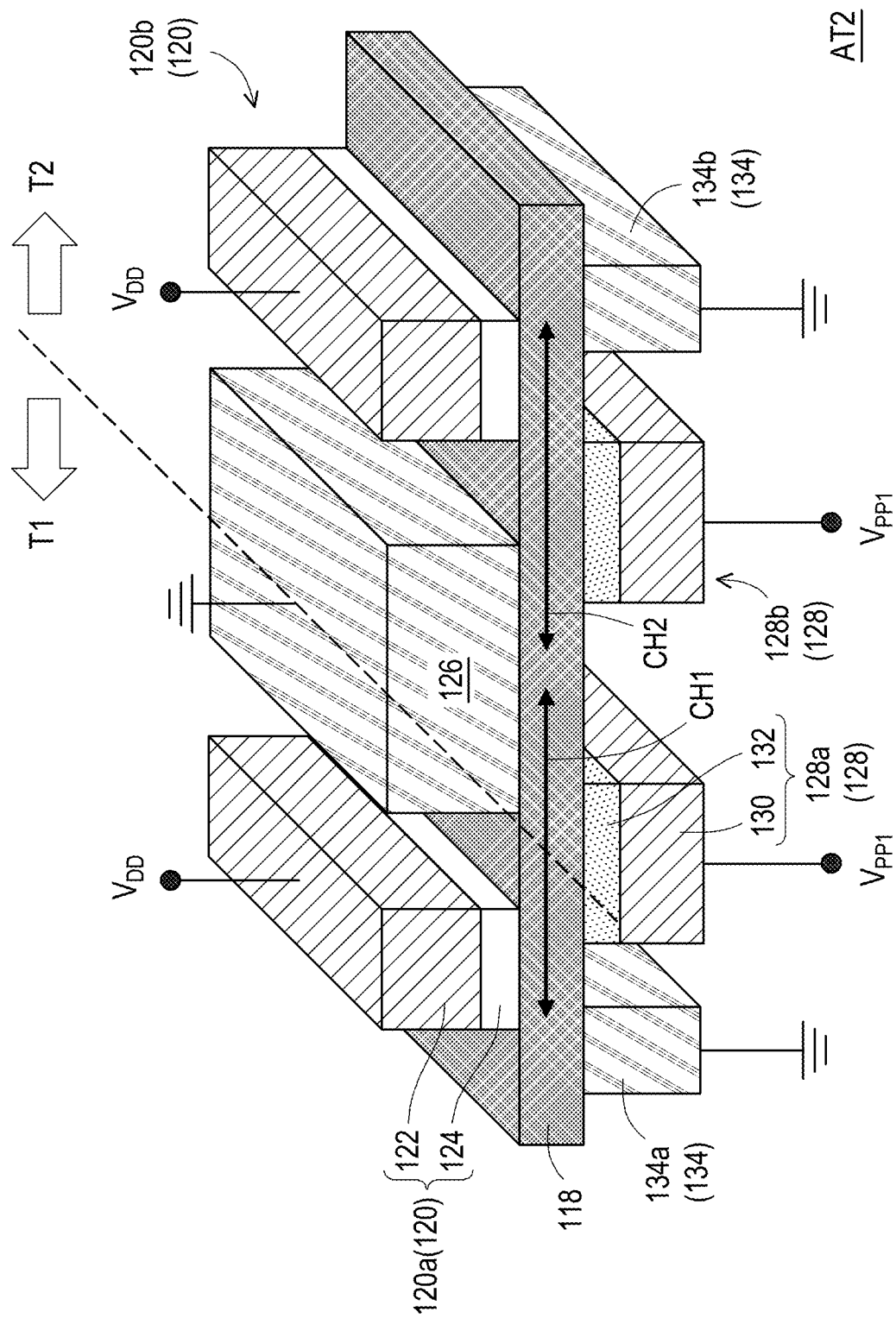
FIG. 6A is a schematic diagram illustrating a pre-programming scheme for programming the ferroelectric layers to have the first electric polarization state.

FIG. 6A is a schematic diagram illustrating a pre-programming scheme for programming the ferroelectric layers 132 to have the first electric polarization state as described with reference to FIG. 2 and FIG. 3A.

Referring to FIG. 6A, in order to program the ferroelectric layers 132, the sub-transistor including the gate capacitor defined between the top gate electrode 122 of the first top gate structure 120a and the channel layer 118 as well as the sub-transistor including the gate capacitor defined between the top gate electrode 122 of the second top gate structure 120b and the channel layer 118 may be turned on by providing a power supply voltage $V_{DD}$ to the top gate electrodes 122. In those embodiments where the channel layer 118 is N-type, the power supply voltage $V_{DD}$ is a positive voltage. In addition, the top source/drain electrode 126 and the bottom source/drain electrodes 134a, 134b may be coupled to a reference voltage (e.g., a ground voltage). Moreover, a programming voltage $V_{PP1}$ is provided to the bottom gate electrodes 130 of the bottom gate structures 128a, 128b. In this way, the ferroelectric layers 132 can be programmed with the first electric polarization state by the voltage bias set across the ferroelectric layers 132 (i.e., a voltage difference between the programming voltage $V_{PP1}$ and the reference voltage). The programming voltage $V_{PP1}$ may be a positive voltage.

Figure 6B:
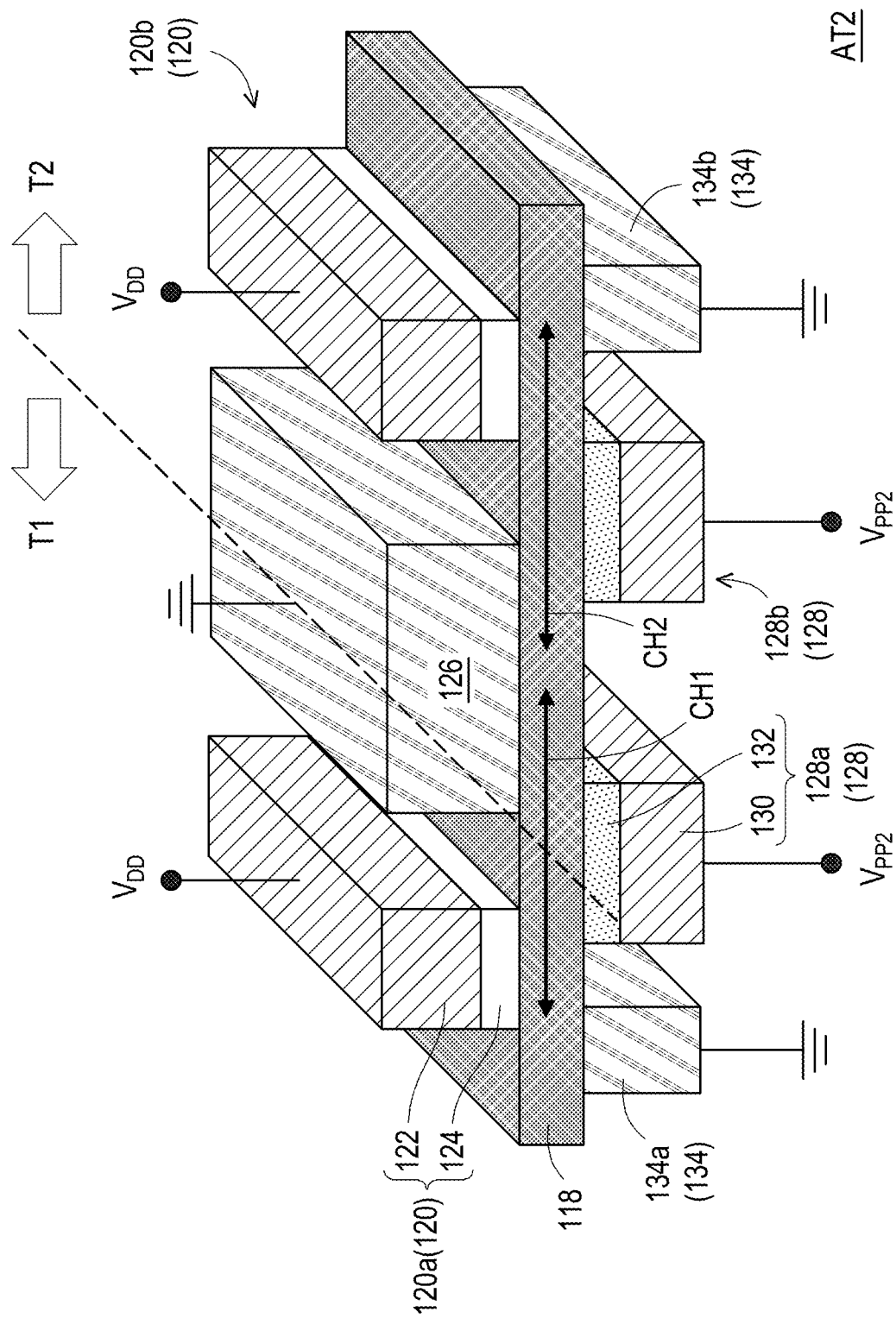
FIG. 6B is a schematic diagram illustrating a pre-programming scheme for programming the ferroelectric layers to have the second electric polarization state.

FIG. 6B is a schematic diagram illustrating a pre-programming scheme for programming the ferroelectric layers 132 to have the second electric polarization state as described with reference to FIG. 2 and FIG. 4A.

Referring to FIG. 6B, the sub-transistor including the gate capacitor defined between the top gate electrode 122 of the first top gate structure 120a and the channel layer 118 as well as the sub-transistor including the gate capacitor defined between the top gate electrode 122 of the second top gate structure 120b and the channel layer 118 may also be turned on while programming the ferroelectric layers 132 with the second electric polarization state. In addition, the top source/drain electrode 126 and the bottom source/drain electrodes 134a, 134b may be coupled to a reference voltage (e.g., a ground voltage) as well. As a difference from the pre-programming scheme described with reference to FIG. 6A, a programming voltage $V_{PP2}$ is provided to the bottom gate electrodes 130 of the bottom gate structures 128a, 128b. The programming voltage $V_{PP2}$ may be a negative voltage, and the ferroelectric layers 132 can be programmed with the second electric polarization state by the voltage bias set across the ferroelectric layers 132 (i.e., a voltage difference between the programming voltage $V_{PP2}$ and the reference voltage).

Figure 6C:
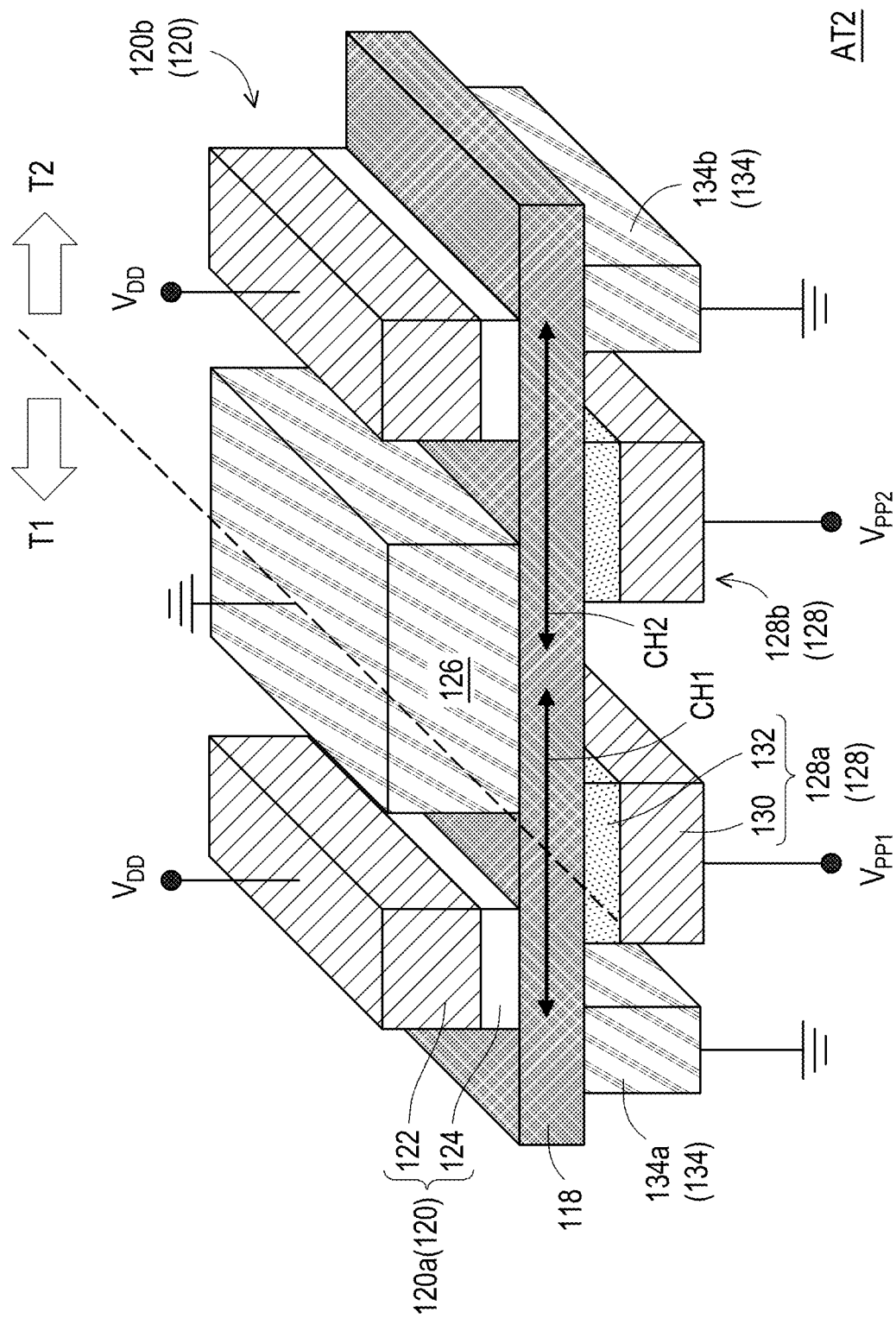
FIG. 6C and FIG. 6D are schematic diagrams each illustrating a pre-programming scheme for programming the ferroelectric layers with the first and second electric polarization states, respectively.
Figure 6D:
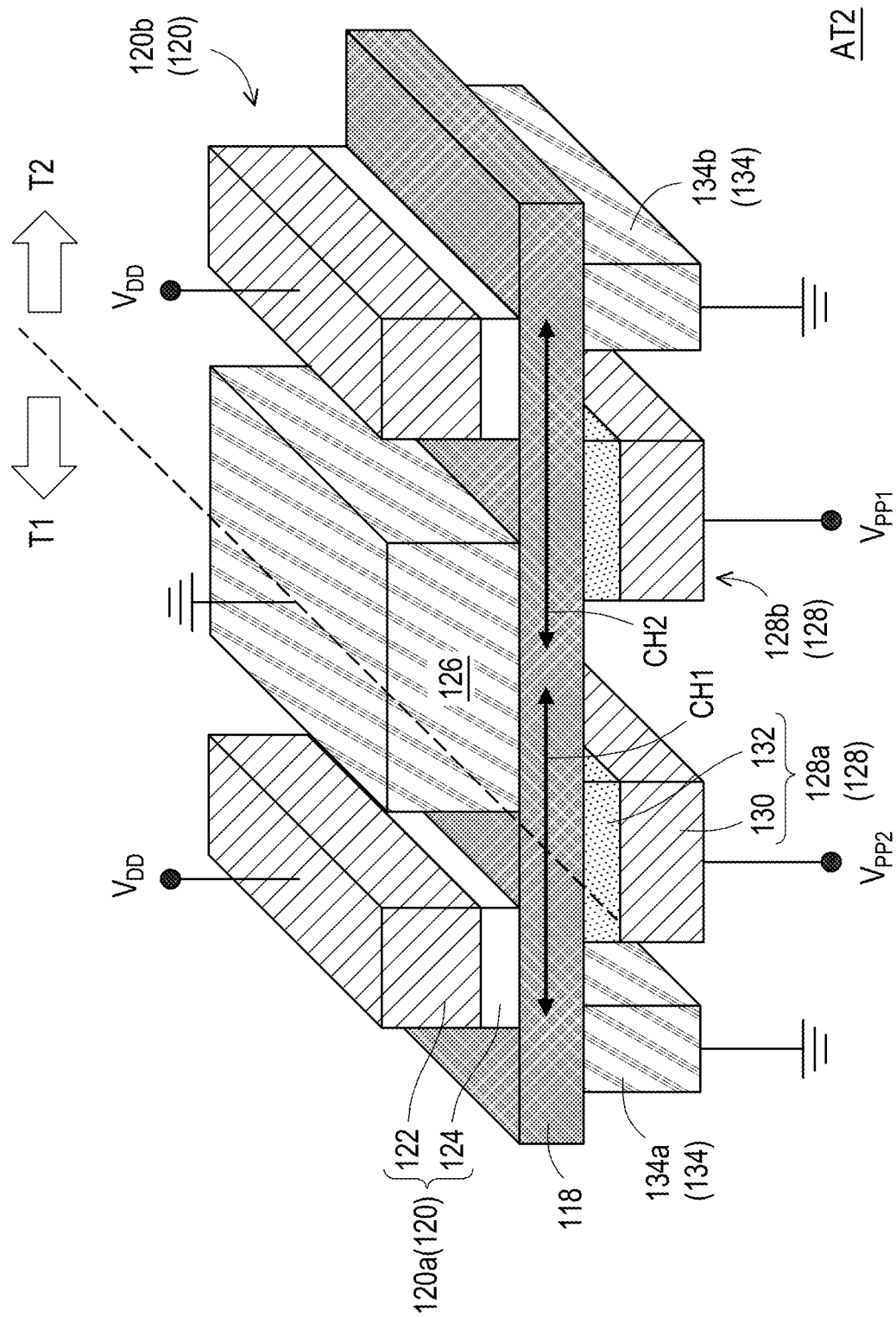

FIG. 6C and FIG. 6D are schematic diagrams each illustrating a pre-programming scheme for programming the ferroelectric layers 132 with the first and second electric polarization states, respectively.

Referring to FIG. 6C, a pre-programming scheme used for preparing the active device AT2 to have the equivalent circuit shown in FIG. 5A is similar to the pre-programming schemes described with reference to FIG. 6A and FIG. 6B, except that the programming voltage $V_{PP1}$ is provided to the bottom gate electrode 130 of the bottom gate structure 128a and the programming voltage $V_{PP2}$ is provided to the bottom gate electrode 130 of the bottom gate structure 128b. A polarity of the programming voltage $V_{PP1}$ is opposite to a polarity of the programming voltage $V_{PP2}$. In those embodiments where the channel layer 118 is N-type, the programming voltage $V_{PP1}$ is a positive voltage, while the programming voltage $V_{PP2}$ may be a negative voltage.

Referring to FIG. 6D, a pre-programming scheme used for preparing the active device AT2 to have the equivalent circuit shown in FIG. 5B is similar to the pre-programming schemes described with reference to FIG. 6A and FIG. 6B, except that the programming voltage $V_{PP2}$ is provided to the bottom gate electrode 130 of the bottom gate structure 128a and the programming voltage $V_{PP1}$ is provided to the bottom gate electrode 130 of the bottom gate structure 128b. A polarity of the programming voltage $V_{PP1}$ is opposite to a polarity of the programming voltage $V_{PP2}$. In those embodiments where the channel layer 118 is N-type, the programming voltage $V_{PP1}$ is a positive voltage, while the programming voltage $V_{PP2}$ may be a negative voltage.

According to various embodiments, the gate voltages $V_A$, $V_B$ provided to the active device AT2 during a logic operation (as shown in FIG. 2) may have magnitudes respectively lower than a magnitude of the programming voltage $V_{PP1}$ and a magnitude of the programming voltage $V_{PP2}$, for preventing from accidentally programming the ferroelectric layers 132 during the logic operation.

As described above, the active device AT2 can perform various logic functions, in corresponding to combinations of the electric polarization states of the ferroelectric layers 132. In addition, one of the pre-programming schemes can be selected for setting the ferroelectric layers 132 with a certain combination of the electric polarization states. Moreover, the same active device AT2 can perform different logic functions at different time, by using different pre-programming schemes before the logic operations. Therefore, the active device AT2 is not only polymorphic, but also reconfigurable. Furthermore, the active device AT2 may be structurally similar to an access transistor of a memory cell in a memory, thus can be disposed near the memory array, and may be configured to drive the memory array.

Figure 7:
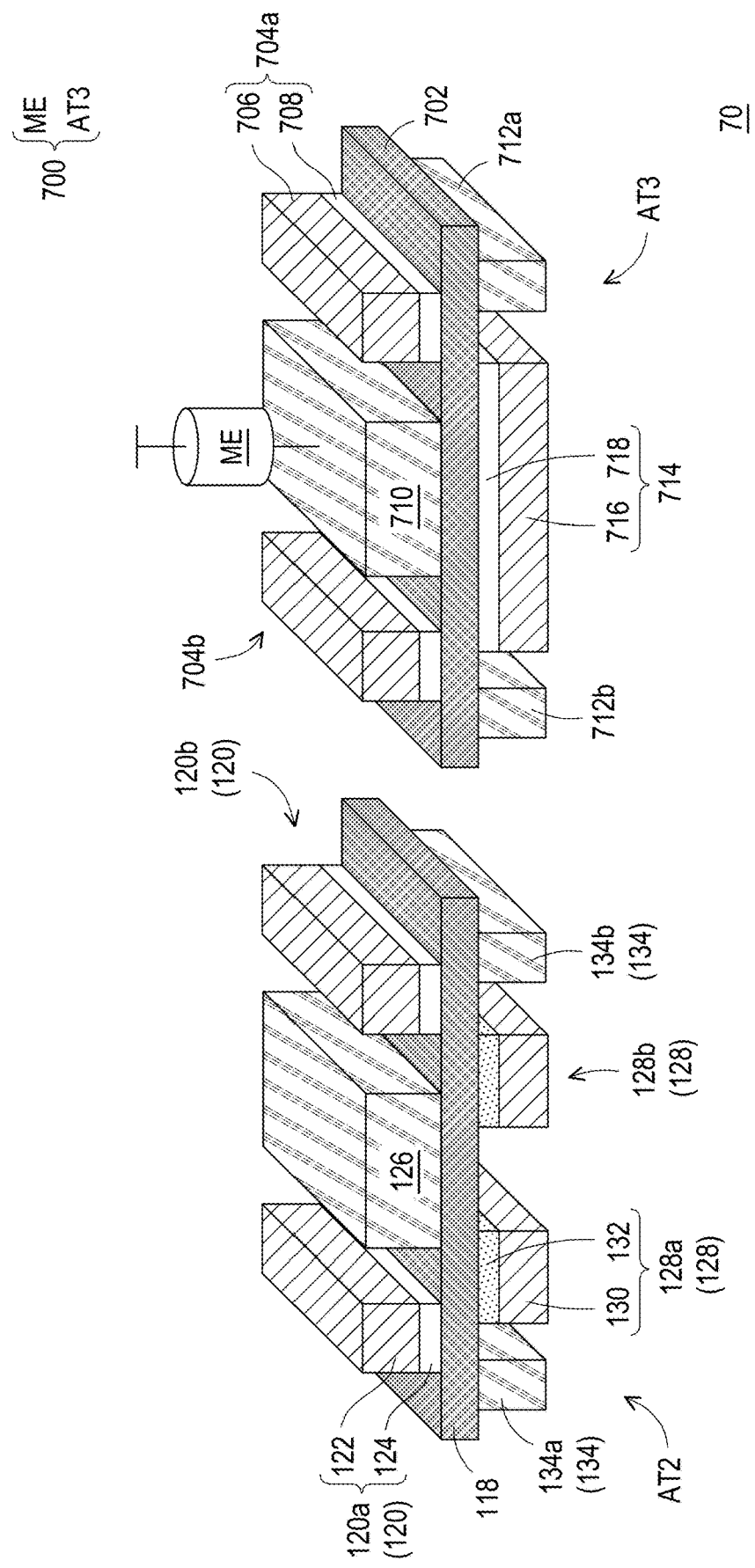
FIG. 7 is a schematic three-dimensional view illustrating one of the back-end active devices and a memory cell in an adjacent memory array, according to some embodiments of the present disclosure.

FIG. 7 is a schematic three-dimensional view illustrating a semiconductor device 70 including the active devices AT2 and an adjacent memory array, according to some embodiments of the present disclosure. For conciseness, only one of the active devices AT2 and one of many memory cells 700 in the memory array are depicted in FIG. 7.

Referring to FIG. 7, according to some embodiments, the active devices AT2 are configured to facilitate operations of a memory array having a plurality of memory cells 700 and laterally adjacent to the active devices AT2. For instance, the active devices AT2 can be configured to process the data stored in the memory cells 700. Each memory cell 700 may include a storage element ME and an access transistor AT3 controlling access of the storage element ME. In some embodiments, the storage element ME is a resistive-type storage element, and can be switched between a low resistance state and a high resistance state. As one of many possible examples, the storage element ME may be a magnetic tunnel junction (MTJ). In alternative embodiments, the storage element ME is a capacitive-type storage element, with a charging state or a changeable capacitance indicating a bit data stored in the memory cell 700.

As similar to the active device AT2, the access transistor AT3 coupled to the storage element ME includes a channel layer 702; two top gate structures 704a, 704b as well as a top source/drain electrode 710 at a top side of the channel layer 702; and two bottom source/drain electrodes 712a, 712b at a bottom side of the channel layer 702. The channel layer 702 of the access transistor AT3 may be identical with the channel layer 118 of the active device AT2 in terms of material. As similar to the top gate structures 120a, 120b of the active device AT2, the top gate structures 704a, 704b of the access transistor AT3 respectively include a gate electrode 706 and a top gate dielectric layer 708 lying between the gate electrode 706 and the channel layer 702. The gate electrode 706 is formed of a conductive material, while the top gate dielectric layer 708 may be formed of a non-ferroelectric dielectric material. The top source/drain electrode 710 is disposed between the top gate structures 704a, 704b, and the storage element ME may be coupled to the access transistor AT3 via the top source/drain electrode 710. In addition, the top source/drain electrode 710 on the top side of the channel layer 702 may be located between the bottom source/drain electrodes 712a, 712b at the bottom side of the channel layer 702. As similar to the top source/drain electrode 126 and the bottom source/drain electrodes 134a, 134b of the active device AT2, the top source/drain electrode 710 and the bottom source/drain electrodes 712a, 712b are respectively formed of a conductive material.

As a difference from the active device AT2, the access transistor AT3 may include a single bottom gate structure 714 at the bottom side of the channel layer 702, rather than two separate bottom gate structures. The bottom gate structure 714 may be located between the bottom source/drain electrodes 712a, 712b, and may be overlapped with the top source/drain electrode 710. In some embodiments, the bottom gate structure 714 includes a bottom gate electrode 716 and a bottom gate dielectric layer 718 lying between the bottom gate electrode 716 and the channel layer 702. The bottom gate electrode 716 may be formed of a conductive material, while the bottom gate dielectric layer 718 may be formed as a non-ferroelectric dielectric material, as similar to the top gate dielectric layers 708. As the bottom gate dielectric layer 718 being non-ferroelectric, the access transistor AT3 may not be polymorphic nor reconfigurable. Instead, the access transistor AT3 may be functioned as a switch for controlling access of the storage element ME.

Despite the differences, the access transistor AT3 is structurally similar to the active device AT2. By adjusting dimensions (e.g., thicknesses) and materials of the elements in the active devices AT2 to be similar or identical with those of the corresponding elements in the access transistors AT3, the active devices AT2 can be disposed near to the memory cells 700 including the access transistors AT3. In addition, the active devices AT2 and the memory cells 700 can both be formed in the BEOL structure BE (as described with reference to FIG. 1). Furthermore, in some embodiments, the active devices AT2 and the memory cells 700 can be disposed at the same horizontal level in the BEOL structure BE. In these embodiments, the active devices AT2 and the access transistors AT3 in the memory cells 700 may be formed in the same sub-set of the dielectric layers 116 in the BEOL structure BE (as described with reference to FIG. 1).

Figure 8:
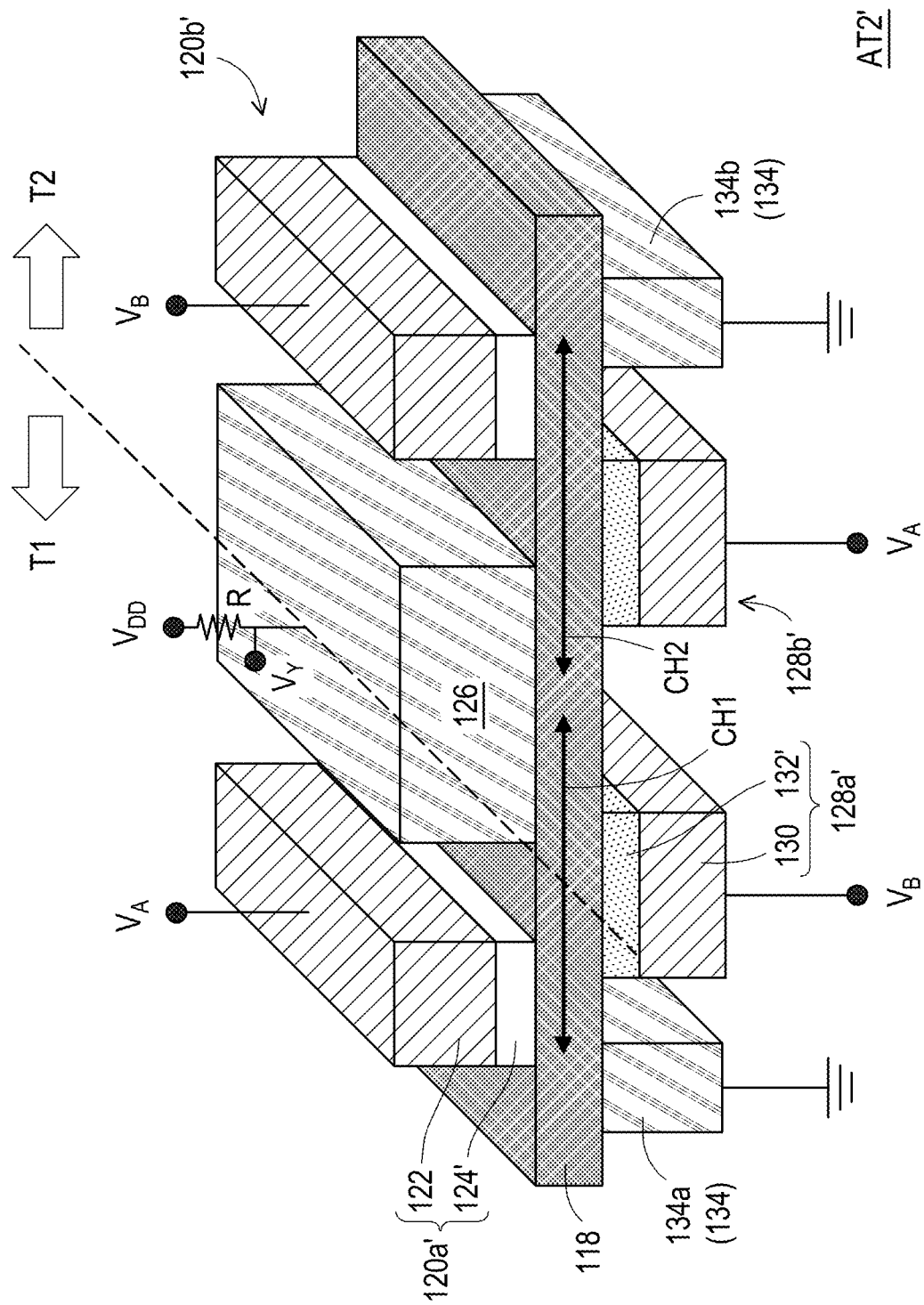
FIG. 8 is a schematic three-dimensional view illustrating an active device, according to some embodiments of the present disclosure.

FIG. 8 is a schematic three-dimensional view illustrating an active device AT2', according to some embodiments of the present disclosure. The active device AT2' is similar to the active device AT2 as described with reference to FIG. 1 and FIG. 2. Only differences between the active devices AT2, AT2' will be described, while the same or the like parts in the active devices AT2, AT2' may not be repeated again.

Referring to FIG. 8, top gate structures 120a', 120b' of the active device AT2' respectively include a ferroelectric layer 124' lying between the overlying top gate electrode 122 and the underlying channel layer 118, rather than a non-ferroelectric gate dielectric layer. On the other hand, bottom gate structures 128a', 128b' respectively include a non-ferroelectric gate dielectric layer 132' lying between the underlying bottom gate electrode 130 and the overlying channel layer 118, rather than a ferroelectric layer. In other words, the active device AT2' may be obtained by switching the top gate dielectric layers 124 and the ferroelectric layers 132 in the active device AT2 described with reference to FIG. 1 and FIG. 2.

As similar to the active device AT2, the active device AT2' includes a first transistor T1 and a second transistor T2. When at least one of the transistors T1, T2 is/are turned on, the voltage $V_Y$ at an output terminal of the active device AT2' may be pulled down. On the other hand, when both of the transistors T1, T2 remain in an off state, the voltage $V_Y$ may keep at a logic high voltage. Switching of the first transistor T1 is controlled by a sub-transistor including a gate capacitor defined between the top gate electrode 122 of the top gate structure 120a' and the channel layer 118 as well as a sub-transistor including a gate capacitor defined between the bottom gate electrode 130 of the bottom gate structure 128a' and the channel layer 118. Similarly, switching of the transistor T2 is controlled by a sub-transistor including a gate capacitor defined between the top gate electrode 122 of the top gate structure 120b' and the channel layer 118 as well as a sub-transistor including a gate capacitor defined between the bottom gate electrode 130 of the bottom gate structure 128b' and the channel layer 118.

The sub-transistors including gate capacitors defined across the ferroelectric layers 124' can respectively act as a normally-off switch or be normally-on and act as a conduction path, depends on the electric polarization state of each ferroelectric layer 124'. Therefore, the active device AT2' can perform various logic operations, in corresponding to combinations of the electric polarization states of the ferroelectric layers 124'. In other words, the active device AT2' is polymorphic. Further, the same active device AT2' can perform different logic functions by applying different pre-programming schemes before the logic operations, thus can be reconfigurable. It should be noted that, the programming voltages (e.g., the programming voltages $V_{PP1}$, $V_{PP2}$ as described with reference to FIG. 6A through FIG. 6D) may be provided to the top gate electrodes 122 while pre-programming the active device AT2', whereas the power supply voltage (e.g., the power supply voltage $V_{DD}$ described with reference to FIG. 6A through FIG. 6D) may be provided to the bottom gate electrodes 130 of the bottom gate structures 128a', 128b'. In addition, the top source/drain electrode 126, and the bottom source/drain electrodes 134a, 134b may be coupled to a reference voltage (e.g., a ground voltage) during the pre-programming operations of the active device AT2'.

Furthermore, the active device AT2' is also structurally similar to the access transistor AT3 as described with reference to FIG. 7. Therefore, a plurality of the active devices AT2' can be disposed around memory cells each including the access transistor AT3, and can be configured to facilitate operations of the memory cells. For instance, the active devices AT2' and the memory cells can both be embedded in the BEOL structure BE (as described with reference to FIG. 1), and may be located at the same horizontal level.

As above, according to various embodiments of the present disclosure, back-end active devices are formed over front-end active devices, and logic operations can be performed by both of the front-end active devices and the back-end active devices. As the logic operations can be partly performed in BEOL structure, valuable estate of FEOL structure can be released, at least in part. The back-end active device has sub-transistors including gate capacitors defined across ferroelectric layers. These sub-transistors can be functioned as switches or can be normally-on, according to electric polarization states of the ferroelectric layers. Therefore, the back-end active devices can respectively perform various logic operations, in corresponding to combinations of the electric polarization states of the ferroelectric layers. In other words, the back-end active devices can be polymorphic. Further, the logic function of each back-end active device can be altered by applying a different pre-programming scheme before next logic operation, thus the back-end active devices can be reconfigurable. As the back-end active devices are polymorphic and reconfigurable, reverse engineering may be ineffective for tracing back circuit design. Furthermore, the back-end active devices can be structurally similar to access transistors in memory cells also embedded in the BEOL structure. Accordingly, the back-end active devices can be disposed near to the memory cells, and may be configured to facilitate operations of the memory cells.

In an aspect of the present disclosure, an active device is provided. The active device comprises: a channel layer; a top source/drain electrode, disposed at a top side of the channel layer; a first bottom source/drain electrode and a second bottom source/drain electrode, disposed at a bottom side of the channel layer; a first gate structure and a second gate structure, located between the top source/drain electrode and the first bottom source/drain electrode and separated from each other by the channel layer, wherein the first gate structure comprises a non-ferroelectric dielectric layer, and the second gate structure comprises a ferroelectric layer; and a third gate structure and a fourth gate structure, located between the top source/drain electrode and the second bottom source/drain electrode and separated from each other by the channel layer, wherein the third gate structure comprises a non-ferroelectric dielectric layer, and the fourth gate structure comprises a ferroelectric layer.

In another aspect of the present disclosure, a semiconductor device is provided. The semiconductor device comprises active devices and memory cells. The active devices respectively comprise: a first channel layer; a first top source/drain electrode, disposed at a top side of the first channel layer; a first bottom source/drain electrode and a second bottom source/drain electrode, disposed at a bottom side of the first channel layer; a first gate structure and a second gate structure, located between the first top source/drain electrode and the first bottom source/drain electrode, wherein the first gate structure comprises a non-ferroelectric dielectric layer, and the second gate structure comprises a ferroelectric layer; and a third gate structure and a fourth gate structure, located between the first top source/drain electrode and the second bottom source/drain electrode, wherein the third gate structure comprises a non-ferroelectric dielectric layer, and the fourth gate structure comprises a ferroelectric layer. The memory cells are laterally adjacent to the active devices, and respectively comprise an access transistor and a storage element coupled to the access transistor.

In yet another aspect of the present disclosure, a semiconductor chip is provided. The semiconductor chip comprises: a substrate; a first active device, formed on the substrate; a stack of dielectric layers, formed over the substrate, wherein the first active device is covered by the stack of dielectric layers; and a second active device, embedded in the stack of dielectric layers. The second active device comprises: a channel layer; a top source/drain electrode, disposed at a top side of the channel layer; a first bottom source/drain electrode and a second bottom source/drain electrode, disposed at a bottom side of the channel layer; a first gate structure and a second gate structure, located between the top source/drain electrode and the first bottom source/drain electrode, wherein the first gate structure comprises a non-ferroelectric dielectric layer, and the second gate structure comprises a ferroelectric layer; and a third gate structure and a fourth gate structure, located between the top source/drain electrode and the second bottom source/drain electrode, wherein the third gate structure comprises a non-ferroelectric dielectric layer, and the fourth gate structure comprises a ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An active device, comprising:
a channel layer;
a top source/drain electrode, disposed at a top side of the channel layer;
a first bottom source/drain electrode and a second bottom source/drain electrode, disposed at a bottom side of the channel layer;
a first gate structure and a second gate structure, located between the top source/drain electrode and the first bottom source/drain electrode and separated from each other by the channel layer, wherein the first gate structure comprises a non-ferroelectric dielectric layer, and the second gate structure comprises a ferroelectric layer; and
a third gate structure and a fourth gate structure, located between the top source/drain electrode and the second bottom source/drain electrode and separated from each other by the channel layer, wherein the third gate structure comprises a non-ferroelectric dielectric layer, and the fourth gate structure comprises a ferroelectric layer.

2. The active device according to claim 1, wherein the first and third gate structures are disposed on the top side of the channel layer, and the second and fourth gate structures are disposed at the bottom side of the channel layer.

3. The active device according to claim 1, wherein the second and fourth gate structures are disposed at the top side of the channel layer, and the first and third gate structures are disposed on the bottom side of the channel layer.

4. The active device according to claim 1, wherein the first gate structure is partially overlapped with the second gate structure, and the third gate structure is partially overlapped with the fourth gate structure.

5. The active device according to claim 1, wherein the ferroelectric layers respectively have a first electric polarization state with a polarization direction pointed toward the channel layer.

6. The active device according to claim 5, wherein the channel layer is N-type, and a sub-transistor comprising the second gate structure and a sub-transistor comprising the fourth gate structure respectively have a negative threshold voltage.

7. The active device according to claim 5, wherein the active device is configured to be a NOR gate.

8. The active device according to claim 1, wherein the ferroelectric layers respectively have a second electric polarization state with a polarization direction pointed away from the channel layer.

9. The active device according to claim 8, wherein the channel layer is N-type, and a sub-transistor comprising the second gate structure and a sub-transistor comprising the fourth gate structure respectively have a positive threshold voltage.

10. The active device according to claim 5, wherein the active device is configured to be a NAND gate.

11. The active device according to claim 1, wherein one of the ferroelectric layers has a first electric polarization state with a polarization direction pointed toward the channel layer, and the other of the ferroelectric layers has a second electric polarization state with a polarization direction pointed away from the channel layer.

12. A semiconductor device, comprising:
active devices, respectively comprising:
a first channel layer;
a first top source/drain electrode, disposed at a top side of the first channel layer;
a first bottom source/drain electrode and a second bottom source/drain electrode, disposed at a bottom side of the first channel layer;
a first gate structure and a second gate structure, located between the first top source/drain electrode and the first bottom source/drain electrode, wherein the first gate structure comprises a non-ferroelectric dielectric layer, and the second gate structure comprises a ferroelectric layer; and
a third gate structure and a fourth gate structure, located between the first top source/drain electrode and the second bottom source/drain electrode, wherein the third gate structure comprises a non-ferroelectric dielectric layer, and the fourth gate structure comprises a ferroelectric layer;
memory cells, laterally adjacent to the active devices, and respectively comprise an access transistor and a storage element coupled to the access transistor.

13. The semiconductor device according to claim 12, wherein the active devices and the memory cells are embedded in a stack of dielectric layers formed on a semiconductor substrate.

14. The semiconductor device according to claim 12, wherein the access transistor comprises:
a second channel layer;
a second top source/drain electrode, disposed at a top side of the second channel layer;
a fifth top gate structure and a sixth top gate structure, disposed at the top side of the second channel layer, wherein the second top source/drain electrode is located between the fifth and sixth top gate structures;
a third bottom source/drain electrode and a fourth bottom source/drain electrode, disposed at a bottom side of the second channel layer; and
a seventh gate structure, disposed at the bottom side of the second channel layer, and located between the third and fourth bottom source/drain electrodes.

15. The semiconductor device according to claim 14, wherein the fifth, sixth and seventh gate structures respectively comprise a non-ferroelectric dielectric layer.

16. The semiconductor device according to claim 14, wherein the storage element is coupled to the second top source/drain electrode of the access transistor.

17. The semiconductor device according to claim 12, wherein the active devices are configured to process data stored in the memory cells.

18. A semiconductor chip, comprising:
- a substrate;
- a first active device, formed on the substrate;
- a stack of dielectric layers, formed over the substrate, wherein the first active device is covered by the stack of dielectric layers; and
- a second active device, embedded in the stack of dielectric layers, and comprising:
  - a channel layer;
  - a top source/drain electrode, disposed at a top side of the channel layer;
  - a first bottom source/drain electrode and a second bottom source/drain electrode, disposed at a bottom side of the channel layer;
  - a first gate structure and a second gate structure, located between the top source/drain electrode and the first bottom source/drain electrode, wherein the first gate structure comprises a non-ferroelectric dielectric layer, and the second gate structure comprises a ferroelectric layer; and
  - a third gate structure and a fourth gate structure, located between the top source/drain electrode and the second bottom source/drain electrode, wherein the third gate structure comprises a non-ferroelectric dielectric layer, and the fourth gate structure comprises a ferroelectric layer.

19. The semiconductor chip according to claim 18, wherein the second active device is configured to perform various logic operations, according to electric polarization states of the ferroelectric layers.

20. The semiconductor chip according to claim 18, wherein the second active device is reconfigurable, and performs different logic operations at different time.

\* \* \* \* \*